United States Patent [19]

Gerdes

[11] Patent Number: 5,124,706
[45] Date of Patent: Jun. 23, 1992

[54] ANALOG TO DIGITAL AND DIGITAL TO ANALOG SIGNAL PROCESSORS

[75] Inventor: Richard C. Gerdes, Tucson, Ariz.

[73] Assignee: WavePhore, Inc., Tempe, Ariz.

[21] Appl. No.: 528,767

[22] Filed: May 24, 1990

Related U.S. Application Data

[63] Continuation-in-part of Ser. No. 408,086, Sep. 15, 1989, Pat. No. 5,021,786.

[51] Int. Cl.$^5$ .............................................. H03M 1/00
[52] U.S. Cl. ................................... 341/156; 341/145; 375/26
[58] Field of Search ............... 341/156, 155, 157, 143, 341/165, 166; 375/25, 26, 27, 28, 24, 33, 34

[56] References Cited

U.S. PATENT DOCUMENTS

| | | | |
|---|---|---|---|
| 3,706,944 | 12/1972 | Tewksbury | 332/11 |
| 3,723,909 | 3/1973 | Condon | 332/11 |
| 3,839,675 | 10/1974 | Wernikoff et al. | 341/155 |
| 4,384,278 | 5/1983 | Benjamin | 340/347 |
| 4,411,002 | 10/1983 | Auger | 375/30 |
| 4,490,714 | 12/1984 | van de Plassche et al. | 341/143 |
| 4,920,544 | 4/1990 | Endo et al. | 375/26 |
| 5,043,729 | 8/1991 | Fujimoto | 341/152 |

OTHER PUBLICATIONS

Gerdes, Richard, "Audio and HDTV: What PSI is Doing About It", Oct. 1988.

"GENESYS: Transmission System for HDTV", Apr. 1988.

Primary Examiner—A. D. Pellinen
Assistant Examiner—Brian K. Young
Attorney, Agent, or Firm—Spensley Horn Jubas & Lubitz

[57] ABSTRACT

Improved analog to digital and digital to analog signal processors are disclosed wherein a quick approximation of the input signal to the signal processor is attained and a more accurate approximation is later attained for the input signal. For the analog to digital conversion, a standard analog to digital converter having a finite resolution or a predetermined quantization error is used to create part of the digital representation. The remainder of digital representation is created by processing an error signal due to the finite resolution of a standard analog to digital converter and the infinite resolution of the analog input signal to a delta modulator. In a digital to analog signal processing circuit, the first part of the digital representation is converted by a standard digital to analog converter and the remaining portion is integrated into a frequency limited analog signal and then summed to reconstruct the analog signal. To avoid overshoot, the integrators of the signal processors are preset based upon the increase or the decrease in the first part. Further, the rate of integration is controlled so that the rate slows as the digital representation of the analog signal becomes increasingly more accurate representation of the input signal.

24 Claims, 21 Drawing Sheets

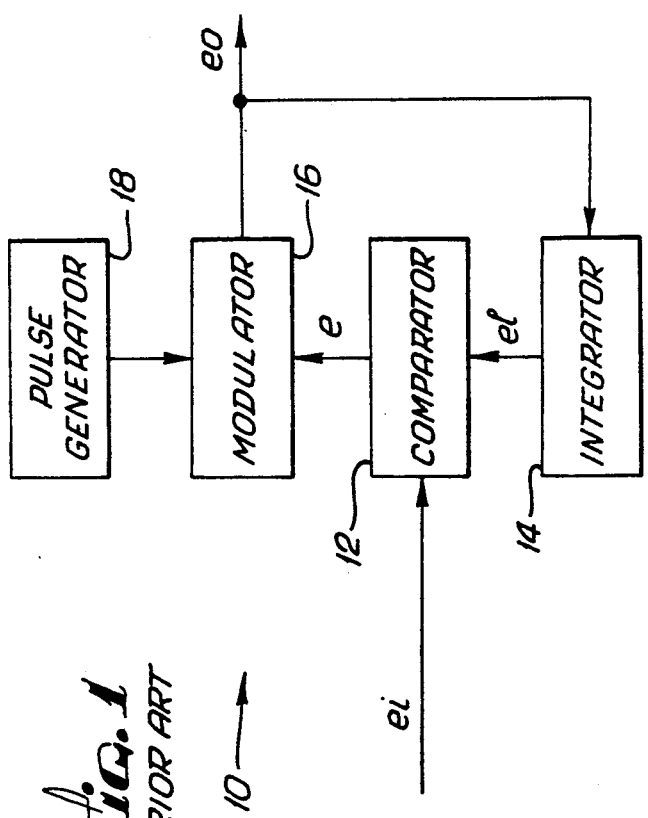
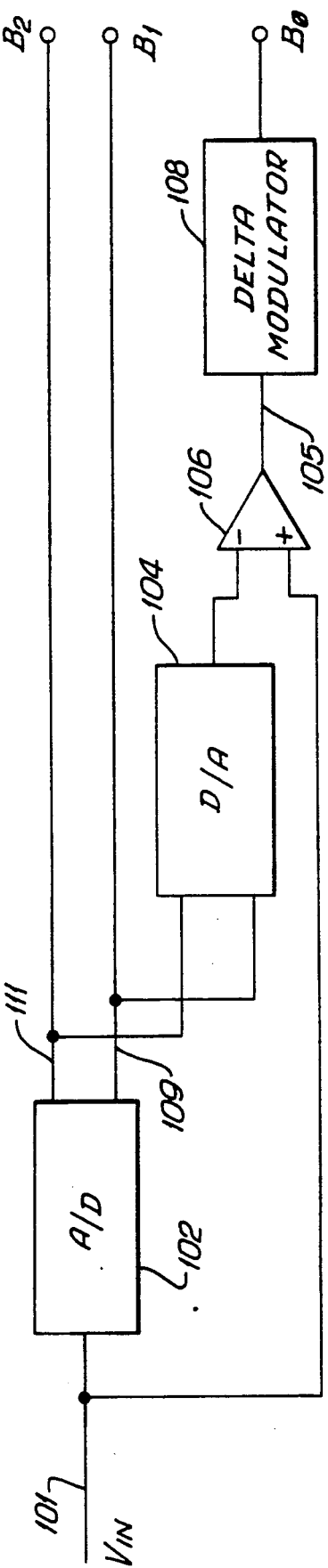

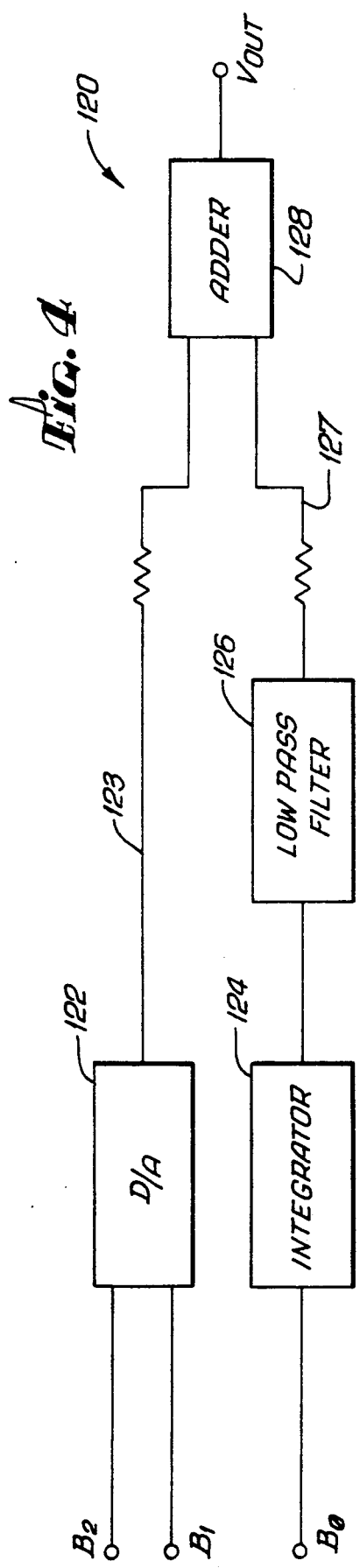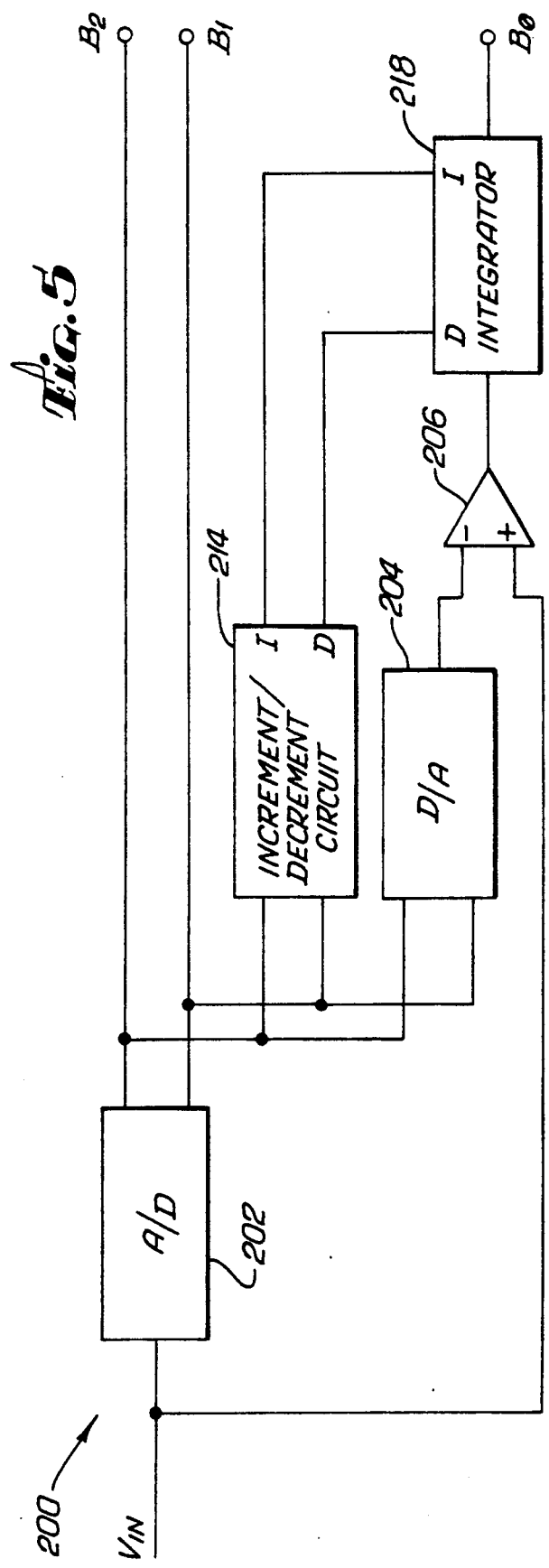

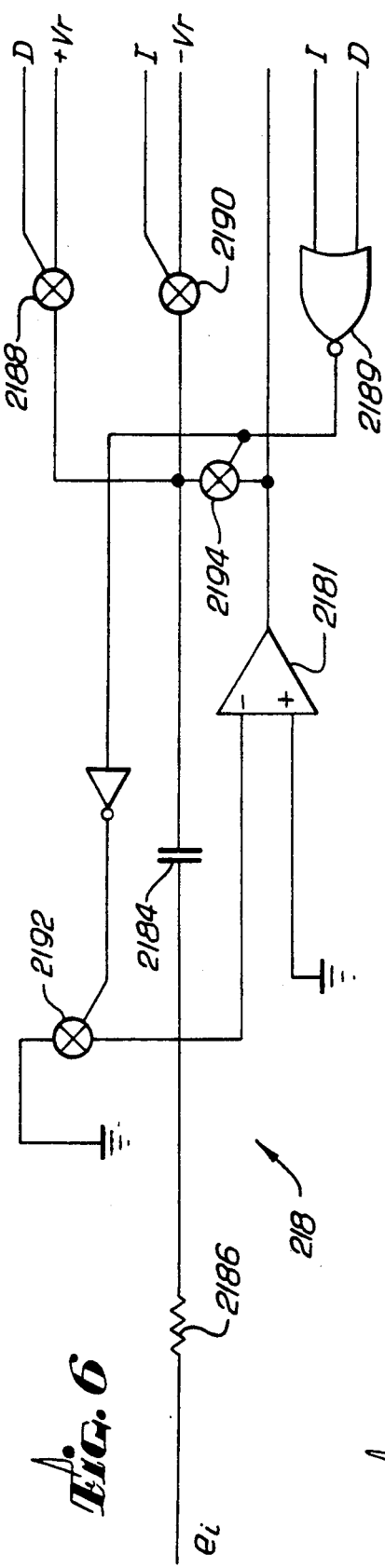
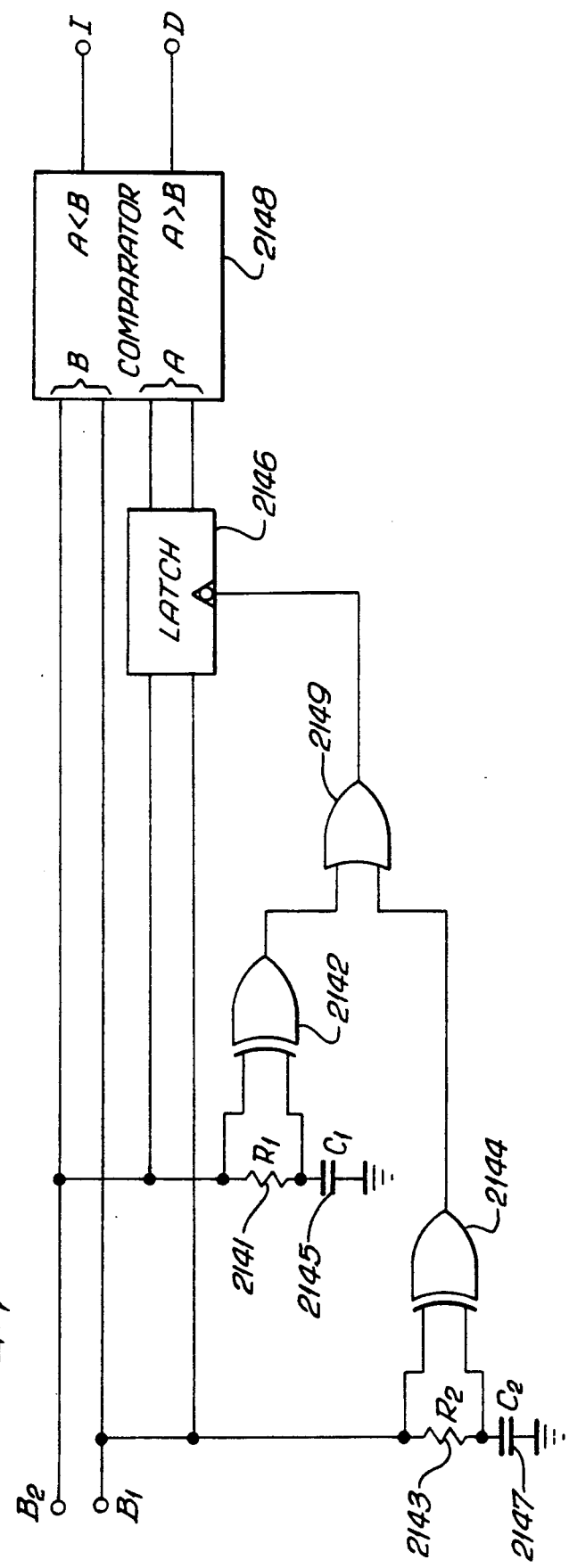
FIG. 6
FIG. 7

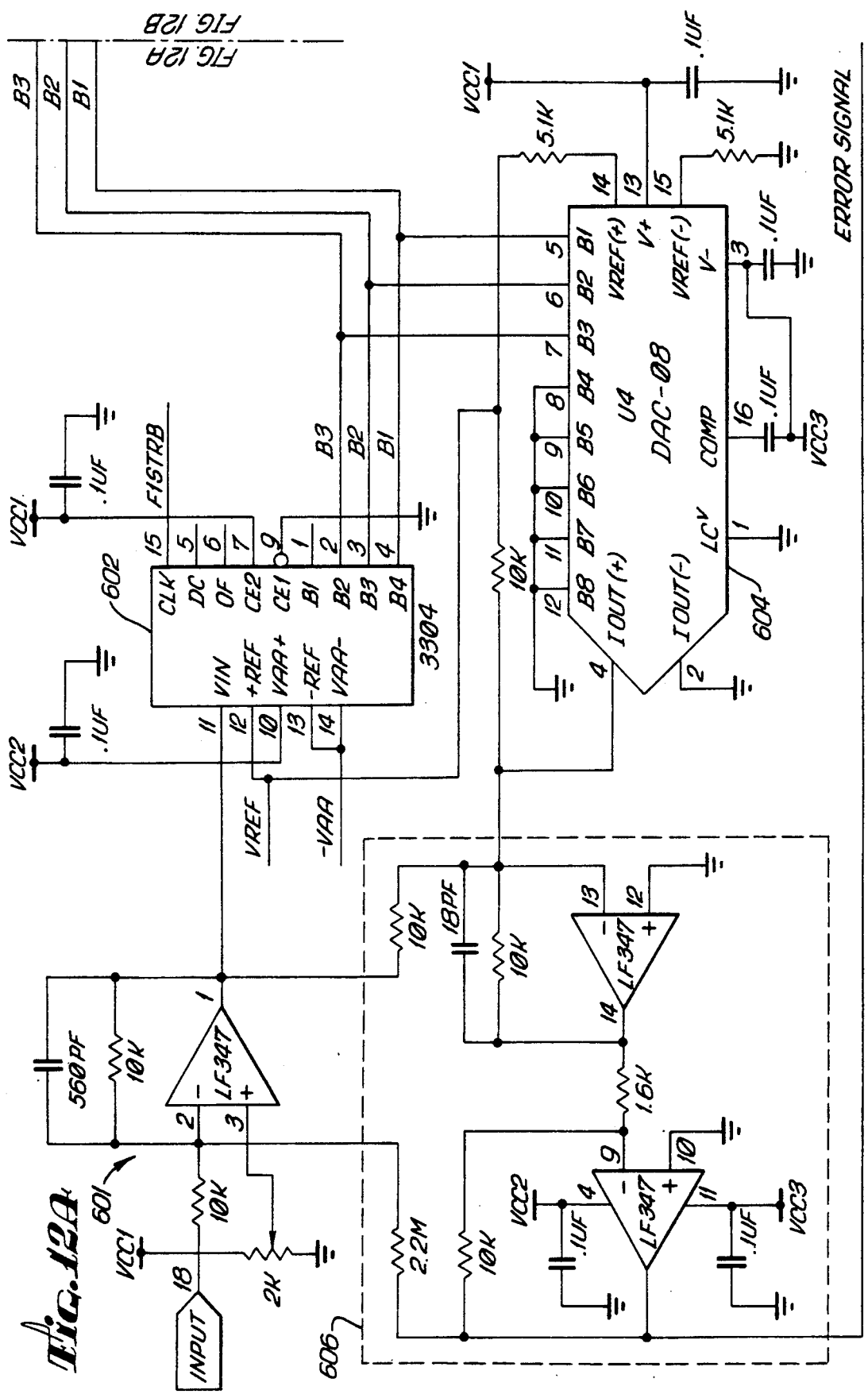

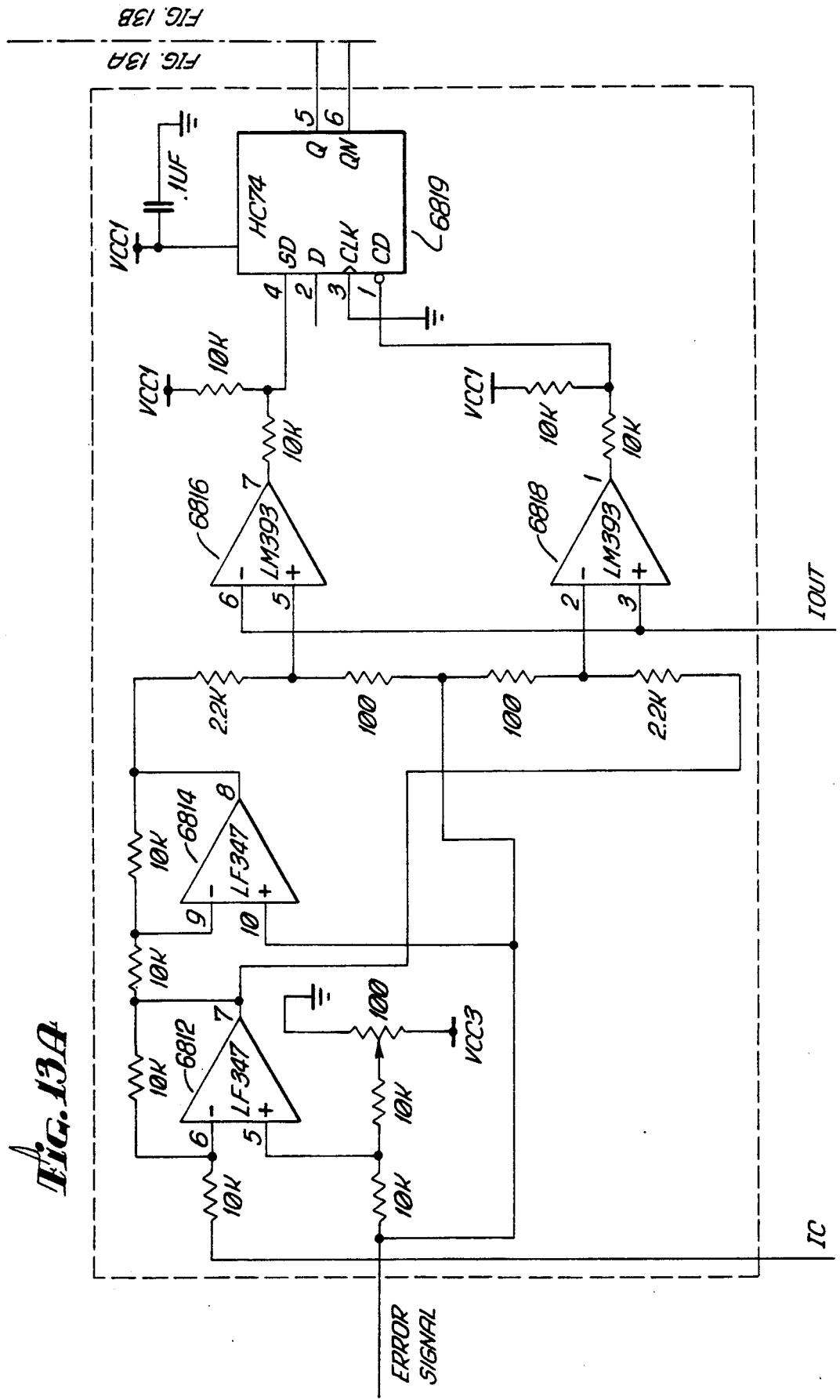

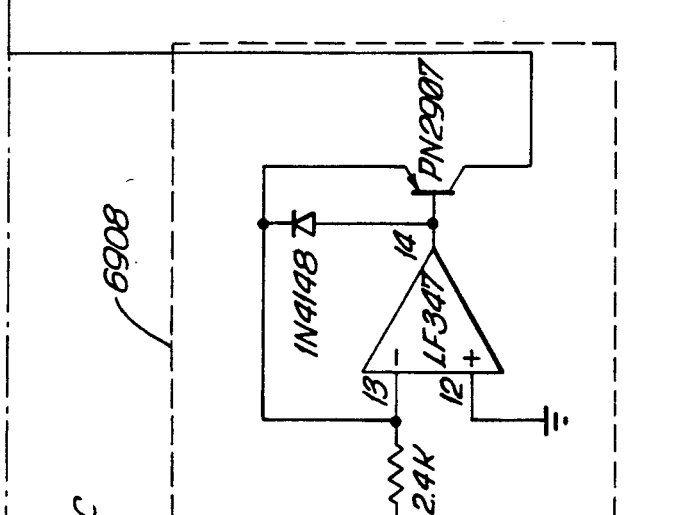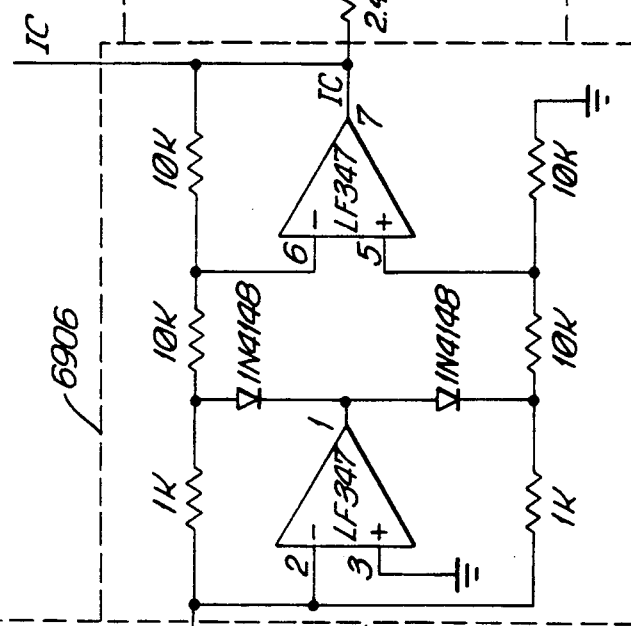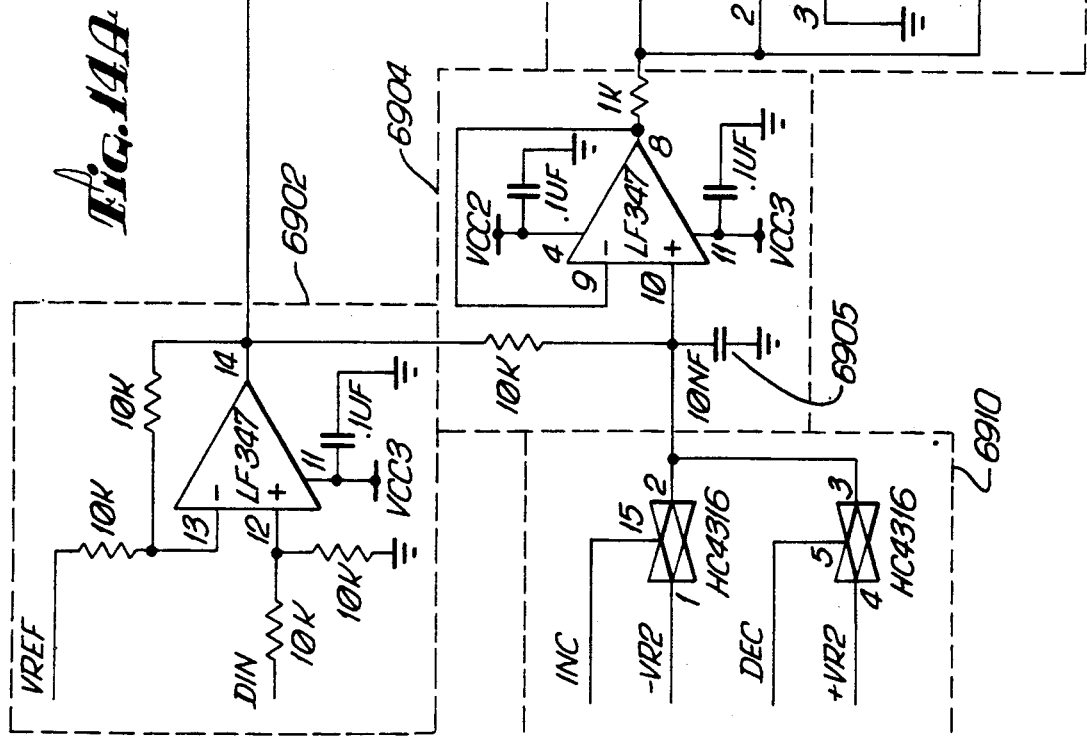
Fig. 14A

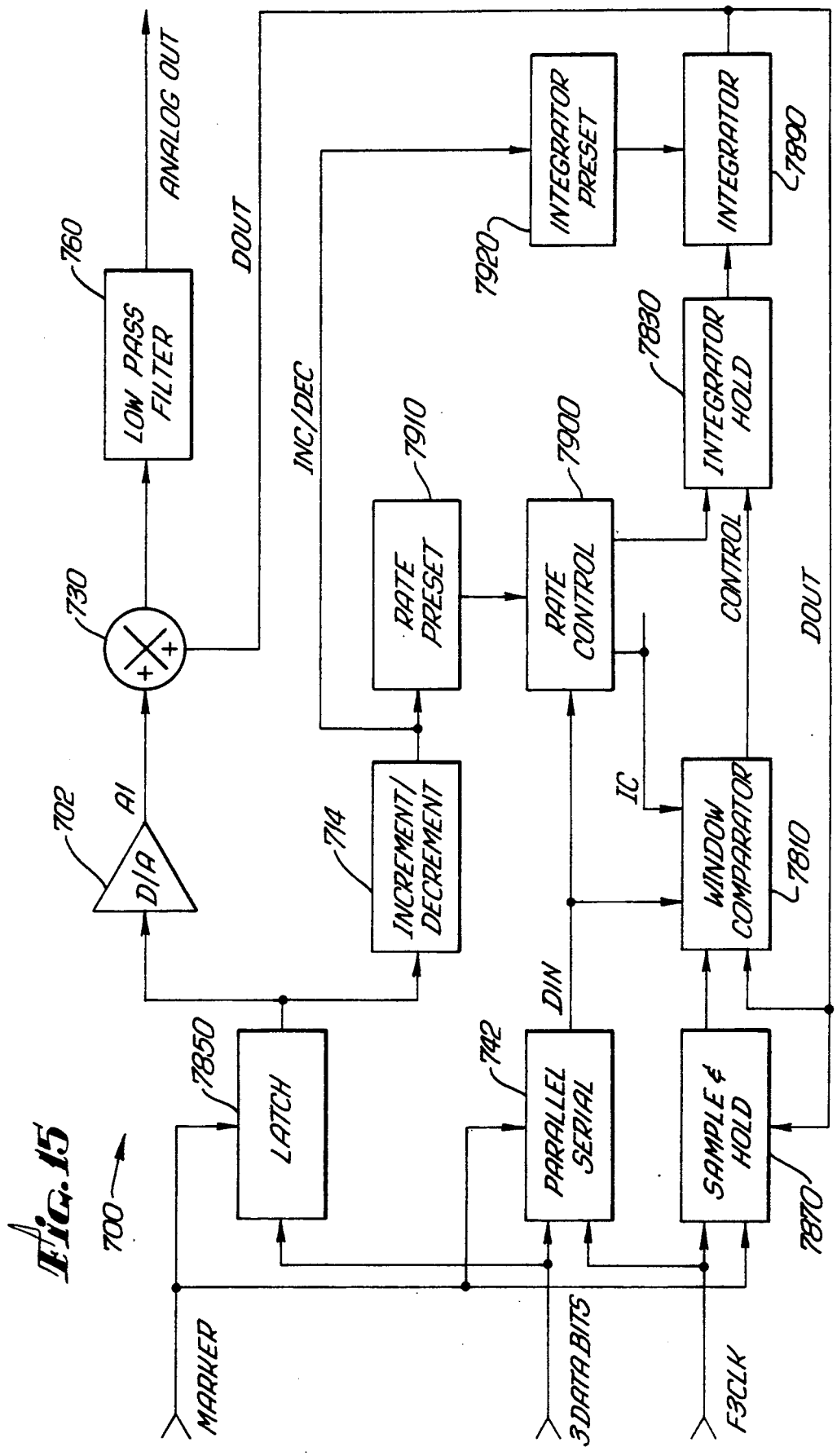

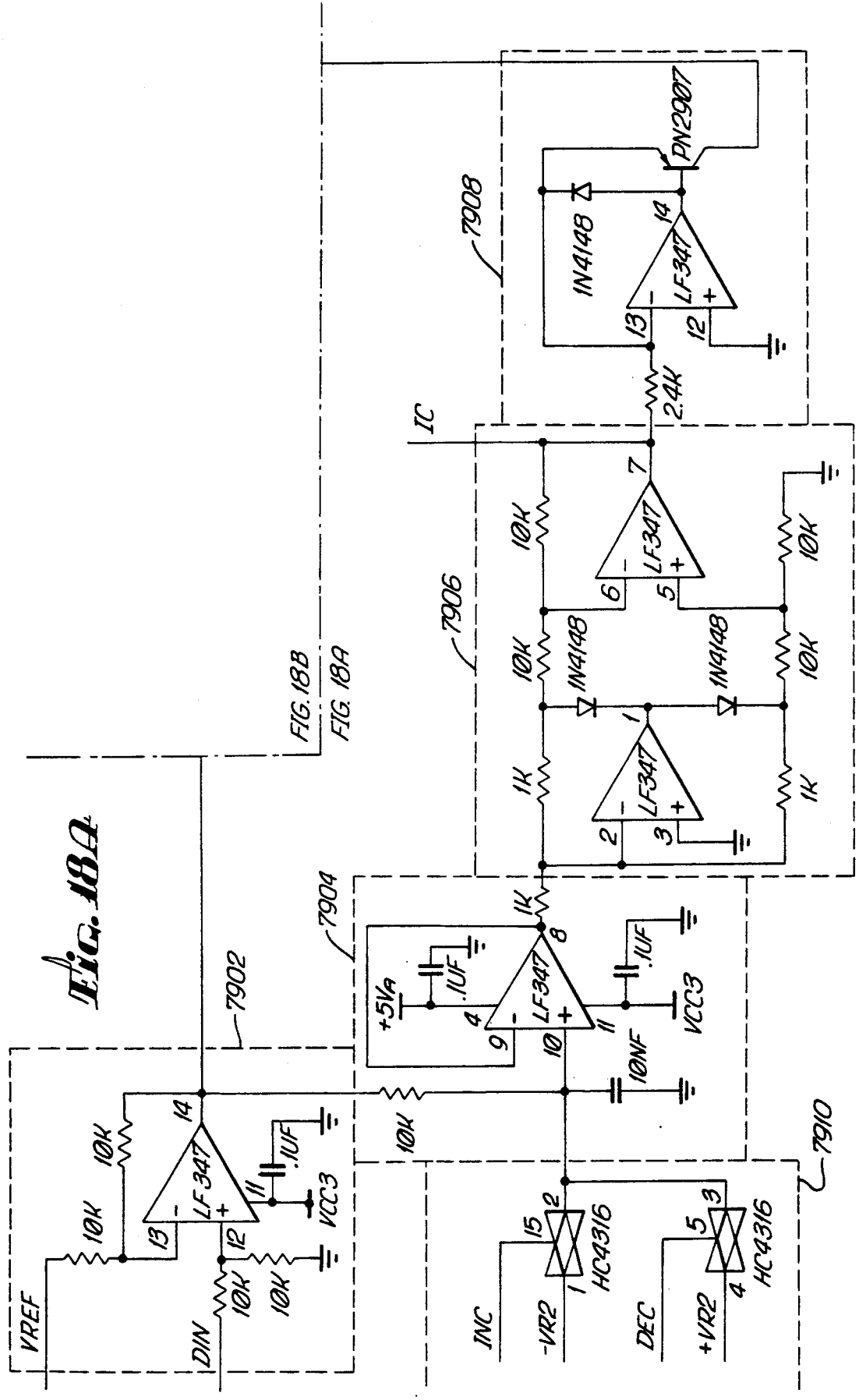

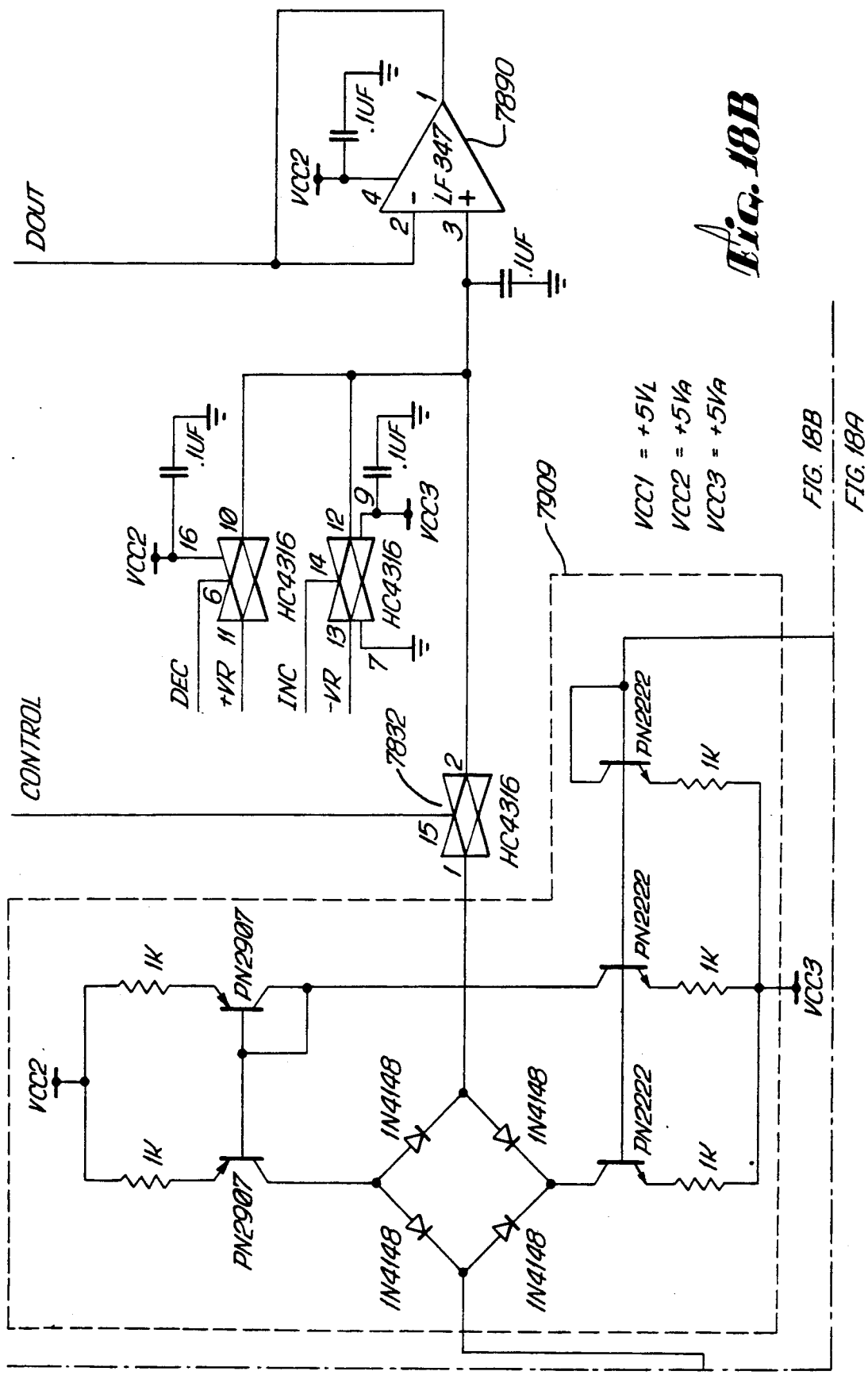

ANALOG TO DIGITAL AND DIGITAL TO ANALOG SIGNAL PROCESSORS

This application is a continuation in part of my copending application, Ser. No. 408,086 filed on Sep. 15, 1989, now U.S. Pat. No. 5,021,786.

BACKGROUND OF THE INVENTION

1. Field of the Invention

This invention relates to using improved analog to digital and digital to analog conversion techniques for digital storage of data and more particularly to using such improved analog to digital and digital to analog conversion techniques using delta modulation for use in optical storage devices.

2. Description of the Prior Art

During the last fifteen years, tremendous time, money and efforts have been devoted to digitally storing analog data. These include digital audio such as in optical storage media like compact discs and digital audio tape (DAT), digital document storage such as optical facsimile storage on compact disc read only memories and digital video such as represented by laser discs and digital video tape.

To store analog data such as on CD discs, DAT, laser discs, and CD ROM's, data must be converted from analog to digital signals. Conversion of analog signals to digital data inherently involves different trade-offs. Most of these tradeoffs involve speed, quantization noise, dynamic range and cost.

For example, analog to digital conversion can involve either a serial process or a parallel process. Serial conversion frequently allows for a simpler and a less costly implementation but tends to be slower than parallel conversion.

A further consideration is the amount of noise that is permitted. The more bits that are used for quantifying the analog signals, the less quantization noise that will result from the conversion and the greater the dynamic range of the system. For example, using simple pulse code modulation (PCM), 128 separate levels as represented by 7 bits are required for a dynamic of 42 dB while 131,072 separate levels or 17 bits is required for a dynamic range greater than 100 dB.

Another way of expressing the noise problem is based upon the resolution of the digital to analog converter. A seven bit digital representation of a five volt input signal provides a resolution of 0.0391 volts (five volts divided by 128) i.e., the digital representation of the analog signal can only reflect changes greater than 0.0391 volts in the analog signal. However a 17 bit representation of the same signal can reflect changes greater than $3.81 \times 10^{-5}$ volts. Of course, the original analog input signal, theoretically has an infinite resolution.

Another problem common with many analog to digital and digital to analog converters is dithering. The analog to digital converter's switching circuitry introduces objectionable noise into the converted signal at low signal levels or with slowly changing signals. To avoid such noise, complicated dithering circuits such as those shown in U.S. Pat. No. 4,490,714 to van de Plassche have been used.

One digital to analog system that may have relatively high dynamic range and low quantization noise is a delta modulation system, which is a one bit output form of a PCM system. FIG. 1 represents the classic delta modulation system 10. An input analog signal $e_i$ signal is fed through a comparator 12 with the output signal $\epsilon$ of the comparator 12 representing which of the input signal $e_i$ and an output $e_i$ of an integrator 14 is greater. That output $\epsilon$ is modulated by a modulator 16 such as a D flip flop supplied with a periodic pulse train from a pulse generator 18. In effect, the modulator 16 samples the output $\epsilon$ of the comparator 12. The output of the modulator $e_0$ is fed back for integration by an integrator 14.

The result is that the output $e_0$ of the delta modulator 10 is a series of pulses. The pulses represent the rate of change of the signal amplitude from sampling instant to sampling instant.

A system 20 to reconstruct the original input signal $e_i$ is shown in FIG. 2. The output $e_0$ of the delta modulator is integrated by an integrator 22 and is then inputted to a low pass filter 24 to eliminate high frequency noise caused by the sampling or the modulation. Alternatively, a frequency limited integrator may be used.

To reduce noise in the system, a higher frequency for the pulse train can be used. Further, instead of using just one integrator in the modulator and demodulator, two integrators may be used. Further details regarding different types of delta modulators may be found in a variety of textbooks, including Philip F. Panther, *Modulation, Noise and Spectral Analysis* (1965).

However, delta modulators have several disadvantages. They are relatively slow in responding to rapid, large changes in the amplitude of the input signal. Further, delta modulators lose all D.C. information contained in the original analog signal. In addition, delta modulators have limited resolution.

The limited resolution of the delta modulators is generally a function of the resolution of the comparators. As a result of the limited resolution of the comparators, the output of a delta modulator will frequently start to dither if the analog input signal remains at a specified level for a substantial duration. Such dithering creates noise in the reconverted analog input.

One drawback of digital storage of analog data is that digitizing analog data typically results in massive amounts of data. For example providing an audio signal of 96 db of dynamic range requires 16 bits of data. If audio signal has a bandwidth of approximately 22 khz, then Nyquist theorem requires that the signal be sampled at at least 44 khz to avoid aliasing noise. Current audio compact discs are sampled at 44.1 khz, resulting in 44,100 samples of 16 bits for each channel of audio per second. If there are two audio channels, as is typical in stereo recording techniques, then there are 88,200 16 bit samples created every second for stereo audio compact discs. Thus, an hour of music requires over 380 million 16 bit samples or over 5 billion bits of data. Of course, typically, error correction coding and additional data for controlling the speed of rotation of the disc in the disc drive is also required. Thus, even more than 5 billion bits of data is generally used for storing digital audio data.

Similar calculations can also be done for video or facsimile data. For example, a facsimile of an 8½" by 11" black and white analog image of a piece of paper can be digitized by dividing the piece of paper into 1/300" by 1/300" squares. Over 8 million bits are required to store that one page. Storing 100 pages of such facsimiles requires 800 million bits, which is near the capacity of common current hard disk magnetic media storage technology commonly used in personal computers. To store a two hour long color movie using high definition video signals with 750,000 pixels at 30 frames per second with a stereo digital audio signal of 96 db dynamic range requires over one hundred sixty two trillion bits of data.

In an attempt to reduce the number of bits, various compression algorithms are used. Although these compression algorithms reduce the number of bits that must be stored, compression of greater than 50% cannot be achieved.

Therefore, it is a first object of this invention to provide a relatively simple analog to digital converter that provides high speed conversion with good resolution. It is a further object of this invention to avoid the use of dithering to remove quantization noise and to avoid the loss of DC signals. And it is a still further object of this invention to provide such a converter that is simple and that may be incorporated into one integrated circuit.

It is still a further object to devise a circuit that allows analog information such as audio signals, video signals, or document facsimiles to be stored with relatively high fidelity while reducing the number of bits.

SUMMARY OF THE INVENTION

These and other objects are achieved by improved analog to digital and digital to analog signal processors. The disclosed analog to digital signal processors include a first converter of a predetermined resolution such as a standard parallel analog to digital converter that creates a partial digital representation of the analog signal. Due to the limited resolution of that converter, the converter's output has a quantization error.

The remaining portion of the digital representation is produced by a second converter of a greater resolution that converts the resultant quantization error due to the limited resolution of the first converter. That second converter is preferably a delta modulator.

Compatible digital to analog signal processors are also disclosed. To process such a digital representation back to an analog signal, the partial digital representation is converted to an analog signal by a digital to analog converter having the same resolution as the first converter. A second digital to analog converter processes the digital representation representative of the quantization error. The outputs of the two converters are then summed.

In a preferred disclosed embodiment of the disclosed analog to digital signal processors, the integrator of the delta modulator is preset to prevent overshoot. This improvement requires a simple circuit called an increment/decrement circuit that monitors the digital output of the standard analog to digital converter for changes. If the digital output of the converter shows an increase from the prior output, then the increment/decrement circuit operates a switch to preset the integrator of the delta modulator to minus one-half the resolution of the standard converter. Conversely, if the digital output of the converter shows a decrease, the increment/decrement circuit operates a switch to preset the integrator to plus one-half the resolution of the standard converter. By presetting the capacitor, overshooting is prevented.

A third preferred embodiment of the disclosed signal processor modifies the time constant of the delta modulator's integrator based upon the output of the delta modulator. A current steering circuit is used to more quickly charge the capacitor of the delta modulator's integrator after initial changes in the output of the first converter, enabling a relatively quick and approximation of the quantization error. Then, the delta modulator's rate control circuit slows the rate of charging of the capacitor, allowing ever increasing resolution of the delta modulator, allowing virtually unlimited resolution.

A fourth preferred embodiment uses the disclosed analog to digital converters to significantly reduce the number of bits to store an analog signal in a digital form. The serial data from the delta modulator is combined into parallel data in a series to parallel shift register having the same number of bits as the standard analog to digital converter. Both the output of the standard converter (the standard A/D data) and the output of the shift register (the Delta A/D data) are supplied to a two to one multiplexer. While the standard A/D data remains unchanged, the multiplexer selects the Delta A/D data from the shift register. If the output of the standard converter changes, the multiplexer selects the standard A/D data from the standard converter. The output of the multiplexer and a digital signal representing whether the standard A/D data has increased or decreased are supplied to standard optical storage or other digital storage devices. This latter signal is called the marker signal.

To convert the information back to analog information, standard optical storage reading circuitry or another digital storage device reading circuitry provides the read data to A 1 to 2 demultiplexer. The demultiplexer uses the marker signal as a control. The presence of a marker signal means that the data from the reading circuitry is standard A/D data. The standard A/D data is provided to a latch circuit. The latch circuit is coupled to the input of a standard digital to analog converter.

The absence of a marker signal signifies that the reading circuitry is providing Delta A/D data. A parallel to serial shift register converts the Delta A/D data to serial data. The serial data is supplied to the appropriate type of integrator for demodulating delta data. The output of the integrator is then added with an analog adder to the output of the standard digital to analog converter.

BRIEF DESCRIPTION OF THE DRAWINGS

FIG. 1 is a block diagram of a prior art delta modulator.

FIG. 2 is a block diagram of a prior art circuit used for converting the output of a delta modulator back into an analog signal.

FIG. 3 is a block diagram of a first embodiment of an analog to digital signal processor for the disclosed invention.

FIG. 4 is a block diagram of a digital to an analog signal processor that is compatible with the processor disclosed in FIG. 3.

FIG. 5 is a block diagram of a second embodiment of an analog to digital signal processor for the disclosed invention that prevents overshoot.

FIG. 6 is a detailed schematic of the integrator used in the delta modulators disclosed in FIG. 5.

FIG. 7 is a detailed schematic of the increment/decrement circuit 214 shown in FIG. 5.

FIGS. 12a, 12b, 12c, 13a, 13b, 14a and 14b are detailed schematic diagrams for the digital to analog converter of the type disclosed in FIG. 11.

FIG. 15 is block diagram of a digital to analog converter compatible with the embodiment of FIG. 11.

FIGS. 16, 17, 18a, 18b, 19 and 20 are detailed schematic diagrams for the digital to analog converter disclosed in FIGS. 12a–12c.

DETAILED DESCRIPTION OF THE PREFERRED EMBODIMENT

Figure 8:
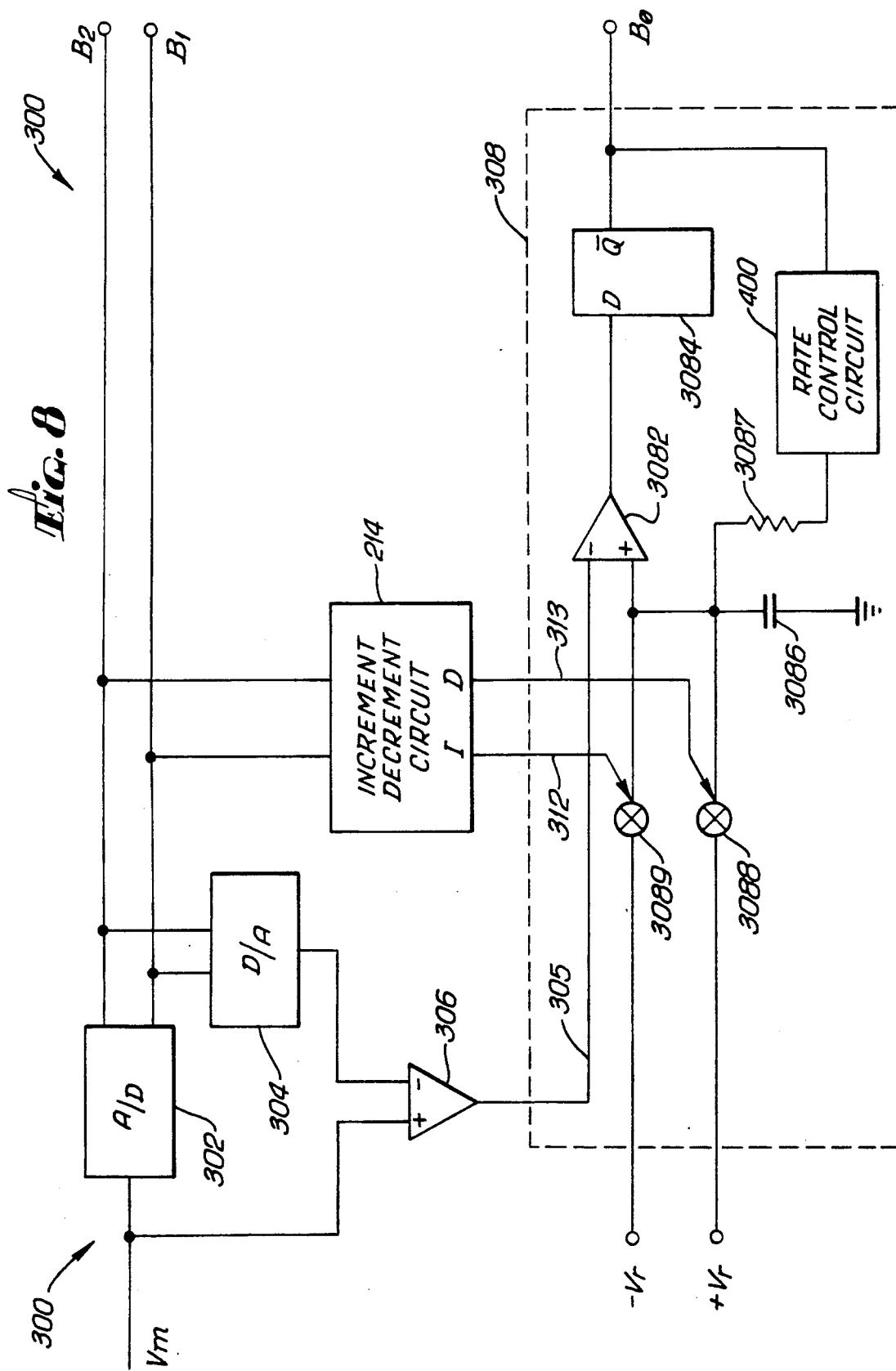
FIG. 8 is a block diagram of a third embodiment of an analog to digital signal processor having a greater resolution than the other two embodiments.

It has been found that the human eye and ear are insensitive to the details of large scale changes in analog audio and video pictures. For example, when a picture is taken from a car moving at 200 miles per hour, most of the details appear blurred. Due to a variety of psycho-visual effects, the eye appears to be unable to ascertain the details of rapidly changing images. Similar psycho-acoustical phenomena appear to keep the ear from hearing the fine details of a sudden large increase in a sound. The listener is only able apparently to perceive the gross changes in the sound. The disclosed analog to digital and digital to analog converters use these psycho-acoustical techniques to store such analog audio and video signals digitally with only an indiscernible reduction of the perceived quality of the subsequently reproduced sound or video image.

FIG. 3 shows a first embodiment 100 of the inventive analog to digital signal processor. An input analog voltage labelled $v_{in}$ is applied to both an analog to digital converter 102 of a known resolution and to the non-inverting input of a differential amplifier 106. The depicted analog to digital converter 102 in this embodiment has two bits of resolution $B_2$ 111 and $B_2$ 109 and supplies the two most significant bits of the processor's output. The two bit output of the converter 102 is also supplied to a digital to analog converter 104 coupled to the inverting input of the differential amplifier 106. The output signal 105 of that differential amplifier 10 represents the quantization noise of the converter 10 due to that converter's limited two bit resolution of the converter 102.

The analog to digital converter 102 can be any of the standard types such as a flash, a successive approximation, a dual slope or an integrating digital to analog converter. The digital to analog converter can be any of the standard types such as a 4 quad multiplying, a multiplying or a R-2R converter. Further, if only one bit of resolution is desired for converter 102, a comparator may be used in the place of the converter.

The error signal 105 is supplied to a standard delta modulator 108 such as the type of delta modulator shown in FIG. 1. The least significant bit of the processor's 100 output $B_0$ is the delta modulator output. It should be noted that this least significant bit output $B_0$ is a serial stream of pulses representative of the quantization noise of the converter 102. It should also be understood that the clock signals for the converters 102 and 104 and the delta modulator 108 have been omitted for clarity. In the preferred version of this embodiment 100, the clock rate for the delta modulator should be equal to or greater than the clock rate for the converters 102 and 104. Alternatively, the clock rate for the delta modulator 108 can be equal to two or three times the clock rate for the converters 102 and 104, allowing the use of an accumulator (not shown) to create parallel delta bits of data.

FIG. 4 shows a digital to analog converter 120 for use with the analog to digital signal processor 100. The two most significant bits $B_2$ and $B_1$ are supplied to a standard digital to analog converter 122 having two bits of resolution. The converter 122 may be of the same type as used for the converter 104 shown in FIG. 3. The least significant input bit $B_0$ is supplied to an integrator 124 such as that shown in FIG. 2 and is then filtered through a low-pass filter 126 such as that shown in FIG. 2. The output 123 of the converter 122 and the output 127 of the filter 126 may then be added by an analog adder 128 to supply a reconstructed analog output signal $v_{out}$ that is approximately equal to the original signal $v_{in}$. Again it should be noted that the to the original input clock signals have been omitted and a faster clock should preferably be applied to the delta modulator.

A principal advantage of this embodiment 100 over the prior art delta modulators is this circuit responds more quickly to gross changes in the analog input signal than the standard delta modulator. The signal processor's 100 digital representation of the input voltage $v_{in}$ will be within 12.5% of the actual instantaneous voltage as quickly as the first converter 102 reacts; i.e., the processor has an almost instantaneous resolution of two bits However, unlike most standard 2 bit analog to digital signal processors, the inclusion of a delta modulator provides a relatively high degree of resolution.

Although the delta modulator provides a high degree of resolution, it will not reach the desired value of the quantization error for a significant period of time (a period dependent upon the period of the pulse train supplied by the pulse generator). However, that delay in providing the highly accurate representation caused by the delta modulator's slow response time may not be important. In systems such as audio or video equipment, the listener's ear or the viewer's eye cannot detect fine details in rapid, gross changes of the input information. Thus, the quick two bit approximation of the actual analog input voltage obtained by the foregoing embodiment may yield a result that is acceptable to the human ear or eye. If a higher degree of instantaneous resolution is desired, an analog to digital converter and a digital to analog converter having more bits of resolution may be used in place of converters 102, 104 and 122.

The embodiment of the signal processor 100 of FIG. 3 is prone to providing a digital representation that is either higher or lower than the actual output voltage when bits $B_2$ and $B_1$ increase. Similarly, the embodiment of FIG. 3 is prone to providing a digital representation that is less than or greater than the actual output voltage when bits $B_2$ and $B_1$ decrease. Such inaccurately high or low digital representations are called overshoot and undershoot respectively.

The embodiment 200 of FIG. 5 prevents overshooting by presetting the integrator 218 (FIG. 6) in the delta modulator 208. (The clock signals to the converters and modulators have again been eliminated for the purpose of clarity). An analog to digital converter 202, a digital to analog converter 204, a differential amplifier 206 and a delta modulator 208 operate in a manner that is quite similar to the manner of operation of the corresponding parts of the embodiment 100 of FIG. 3 operates. However, the circuit includes an increment/decrement circuit 214 and a special integrator 218 (FIG. 6) that has been substituted for the standard integrator (not shown) used in the delta modulator of the embodiment 100.

The integrator 218 shown in FIG. 6 has circuitry to allow the capacitor 2184 of the integrator to be preset. In the integrator 218, a standard differential amplifier 2181 is coupled with a capacitor 2184 in a feedback circuit to integrate the input voltage $e_i$ along with an input resistor 2186. The presetting of the capacitor 2184 is controlled by an increment signal I or a decrement signal D supplied from the increment/decrement circuit 214 to analog switches 2188 and 2190 and supplied through nor gate 2189 to analog switch 2192 and through inverter 2193 to analog switch 2194. These switches may be ordinary CMOS analog switches such as 74HC4316 switches.

When the increment/decrement circuit detects that the output of the converter 202 has increased, switch 2194 opens and switches 2188 and 2192 close to preset the integrator 2180 to $-v_r$. Conversely, when the increment/decrement circuit 214 detects that the output of the converter 202 has decreased, switch 2194 opens and switches 2190 and 2192 close to preset the capacitor 2184 of the integrator 218 to $+v_r$.

Optimally, $v_r$ should be chosen to be one-half of the resolution of the analog to digital converter 202. Thus, in the case shown where the resolution is two bits (or 25%), then $v_r$ should be one-eighth of the maximum full scale input voltage $v_{in}$, (referred to hereafter as $V_{fullscale}$).

By choosing $v_r$ to be one-half of the resolution of the converter 202, the modulator is prevented from overshooting the input signal. For example, suppose the input voltage $V_{in}$ increases from 13% of $V_{fullscale}$ to 53% of $V_{fullscale}$. Prior to that increase, the output of the delta modulator should represent 0.5% of $V_{fullscale}$: the difference between the digital representation of $B_2B_1$ and the actual input voltage. When $V_{in}$ increases from 13% to 53%, $B_2B_1$ changes from 00 to 10, which has a value of 62.5% of $V_{fullscale}$, or an overshoot of 9.5%. Without presetting the capacitor, the output of the delta modulator would still represent 0.5% of $V_{fullscale}$ due to the slow response time of the delta modulator. The combined overshoot would be 10%.

However, the increment/decrement circuit 214 detects an increment, causing switch 2188 to close. The closing of switch 2188 forces the capacitor 2184 and therefore the output of the integrator 218 to $-v_r$; i.e. the integrator has been preset to $-v_r$. As a result of the integrator being preset to $-v_r$, the integrator will cause the delta modulator to eliminate the overshoot. Instead, the delta modulator will provide an undershoot of 3.0% in this instance. Eventually, the delta modulator will compensate for the undershoot by correcting its output to represent the actual quantization error of the analog to digital converter.

The details of the increment/decrement circuit 214 of FIG. 5 are shown in FIG. 7. The increment/decrement circuit comprises two exclusive or gates 2142 and 2144, an or gate 2149, a latch 2146, such as an 74HC174 and a comparator 2148 such as an 74HC85. The exclusive or gates 2142 and 2144 and the or gate 2149 cooperate to create a strobe signal whenever one or more of the $B_2$ and the $B_1$ bits change. The values of resistors $R_1$ 2141 and $R_2$ 2143 and the capacitors $C_1$ 2145 and $C_2$ 2147 should be selected to have a time constant sufficiently long so that the strobe signal will properly operate the latch 2146. Alternatively, latch 2146 could be clocked, allowing for the elimination of gates 2142, 2144 and 2149, resistors 2141 and 2143, and capacitors 2145 and 2147. A decrement signal D goes high approximately simultaneously with the strobe signal if the new state of these two bits represents a number less than the prior state. The increment signal I becomes high if these two bits represent a number greater than the prior number. Shortly after either signal becoming high, the strobe signal causes the latch to store the new values of $B_2$ and $B_1$ so that the increment and the decrement signals return to a low state.

It will be readily understood by those of ordinary skill that the signal processor 200 described in FIG. 5 can be readily adapted to have more bits of parallel resolution just as the embodiment 100 can be modified. The increment/decrement circuit 214 must be modified so that the comparator 2148 compares the latched value of the additional bits with the current value of the additional bits. Also, those of ordinary skill will also readily understand that an additional resistor, an additional capacitor, an additional exclusive or gate and an additional input to or gate 2149 will be needed to create the strobe signal. Further, those of ordinary skill in the art will also understand how to use the strobe signal to synthesize a clock signal.

The embodiment of the analog to digital signal processor of FIG. 5 requires a specialized circuit for converting the digital representation back to the analog signal. The two most significant bits $B_2$ and B are supplied to a two bit resolution standard digital to analog converter and to an increment/decrement circuit that is identical to the circuit shown in FIG. 7. The least significant bit of the output, $B_0$, is coupled to the input of an integrator of the type shown in FIG. 6. The increment/decrement circuit 214 is also coupled to the switches of the integrator for presetting the integrator's capacitor in the manner described above. Preferably, the integrator should be frequency limited to eliminate noise from the modulator. The output of the integrator is then added by an analog adder circuit to the output of the digital to analog converter to reconstruct the input voltage. Those of ordinary skill in the art will also understand how to modify this type of digital to analog signal processor if the number of parallel bits of the input data are either increased or decreased.

A still further improved embodiment 300 of the embodiment 200 is shown in FIG. 8. (Again, all clock signals have been omitted for the purpose of clarity). A standard analog to digital converter 302 having two bits of resolution converts the input analog voltage $v_{in}$ into the two most significant bits of the digital representation, $B_2$ and $B_1$. These two most significant bits are also coupled to an increment/decrement circuit 214 of the type shown in FIG. 7 and to a standard digital/analog converter 304. The output of the digital to analog converter 304, which represents a limited resolution version of the analog input signal $v_{in}$, is supplied to the inverting input of an differential amplifier 306. The input voltage $v_{in}$ is applied to the non inverting input of the differential amplifier 306. Thus, the output of the differential amplifier 306 provides as its output a quantization error signal 305. This quantization error signal 305 exists due to the limited two bit resolution of the analog to digital converter 302. The quantization error signal 305 and a increment signal I 312 and a decrement signal D 313 are supplied to a modified delta modulator 308. The delta modulator 308 comprises a comparator 3082, a D flip-flop 3084, a rate control circuit 400, a resistor 3087, a signal capacitor 3086, and analog switches 3088 and 3089. The resistor 3087 and the signal capacitor 3086 comprise an integrator or accumulator and should be selected such that the integrator reaches 12.5% of the input voltage in $\frac{1}{2}$ of a clock cycle of the D flip-flop. Further, the clock rate of the D flip-flop should preferably be equal to or greater than the rate of the clock signal (not shown) applied to the converters 302 and 304. Alternatively the clock rate for the D flip-flop may be two or three times the clock rate of the clock signal for the converters, allowing the use of an accumulator (not shown) to create parallel delta modulator bits.

Analog switches 3088 and 3089 preset the signal capacitor 3086 of the integrator in the same manner as switches 2188 and 2190 of preset the integrator 208 of the embodiment of FIG. 6. For example, where the input voltage causes the two most significant bits $B_2B_1$ to increase, the signal capacitor 3086 is preset to $-v_4$ while if the two most significant bits decrease, the signal capacitor 3086 is preset to $+v_4$.

The operation of the remainder of the delta modulator 308 will now be explained. The signal capacitor 3086 is preset by the closing of one of the analog switches when the two most significant bits change. The comparator 3082 compares the voltage across the signal capacitor 3086 with the quantization error signal 305, representing the difference between the actual input voltage and the digital representation of $B_2$ and $B_1$. If the error signal is less than the voltage across the capacitor 3086, the output of the comparator 3082 becomes high and the output Q inverted of the flip-flop 3084 becomes low at the next clock pulse. Thus, the least significant bit, $B_0$ becomes low. In response to Q inverted ($B_0$) becoming low, the rate control circuit 400 causes the voltage across the signal capacitor 3086 to decrease in a manner that will be explained below. If the error signal is greater than the voltage across the capacitance, the rate control circuit 400 responds in the opposite manner to cause the voltage across the signal capacitor 3086 to increase in a manner that will be explained below.

The rate control circuit 400 charges or discharges the signal capacitor 3086 initially at a high rate after a change in the two most significant bits so that the least significant bit $B_0$ will provide a quick approximation of the error signal to a compatible digital to analog processor described below. As time continues, the rate control circuit 400 slows the rate of charging as the signal capacitor 3176 provides an increasingly accurate representation of that error signal to the appropriate digital to analog signal processor discussed below. Thus, the rate control circuit 400 charges the signal capacitor 3086 quickly to attain a rough approximation of the actual error signal and then more slowly to attain a more accurate approximation of the signal.

Figure 9:
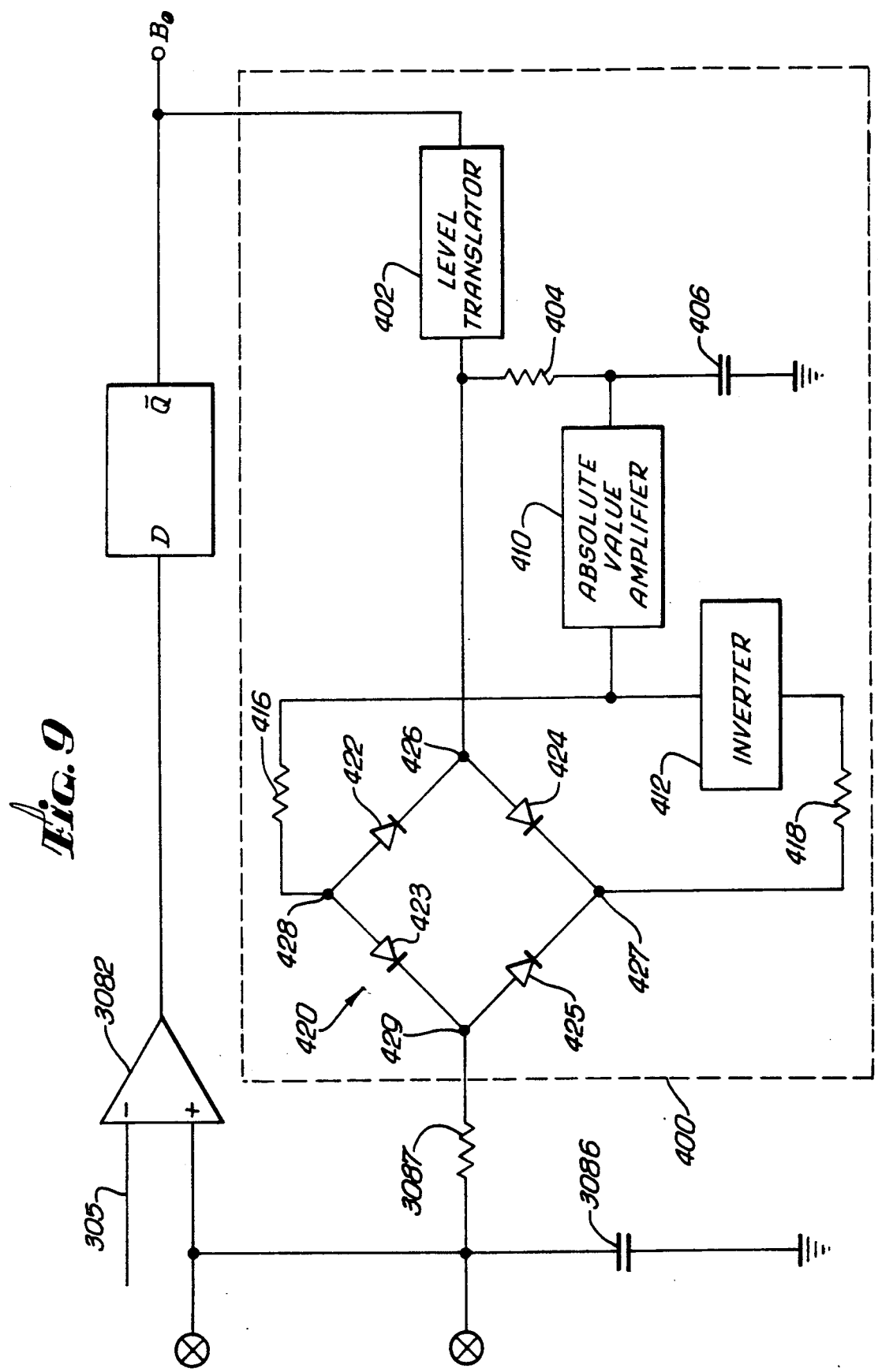
FIG. 9 is a detailed schematic of the rate control circuit 400 shown in FIG. 8 together with certain additional components of the embodiment shown in FIG. 8.

FIG. 9 shows a detailed schematic of the rate control circuit 400 and certain additional components of the third embodiment 300. The least significant bit $B_0$ of the signal processor's output 300 is coupled to the input of the rate control circuit 400 through a level shifter 402 that translates the TTL level output at Be to a symmetrical voltage such as $+/-5$ volts or $+/-2.5$ volts. A resistor 404 and a rate capacitor 406 form a rate averaging circuit. The output of the rate averaging circuit is coupled to an absolute value amplifier 410, which in turn is coupled to an inverter 412. The output of the level shifter 402 is also coupled directly to one node 426 of a diode bridge 420. The absolute value amplifier 410 is coupled through the matched resistors 416 and 418 and the inverter 412 to two other nodes 427, 428 of the diode bridge 420. The resistance of resistors 404, 416 and 418 should be similar to the resistance of resistor 3087 and the capacitance of the rate capacitor 406 should be approximately equal to the capacitance of the signal capacitor 3086.

The diode bridge 420 comprises diodes 422-425 and acts to steer the appropriate charging current to the signal capacitor 3086. For example, assume that analog switch 3088 has just closed, forcing the voltage across the signal capacitor 3086 to $-v_4$. In this example, the voltage across the signal capacitor 3086 is less than the error signal, so $B_0$ is high and the output of the level shifter 402 is approximately 5 volts. Thus, the voltage at the node 426 of the diode bridge is much greater than the voltage at an output node 429 (which will be approximately $-v_r$). Further, due to the averaging effect of the rate capacitor 406, the node 428 will be less than the voltage at the node 426 but greater than the voltage at the node 429. Due to the presence of the inverter 412, the voltage at the node 427 is less than the voltage across the signal capacitor 3086 or at the node 426. Thus, diodes 423 and 424 will conduct, charging the signal capacitor 3086 until the voltage across the signal capacitor is greater than the voltage of the error signal 305.

If the voltage across the signal capacitor 3086 is greater than the quantization error signal 305, the output of the comparator 3082 becomes high and the least significant bit $B_0$ becomes low. With the least significant bit changing to low, the output of the level shifter 402 switches to minus 5 volts, turning off diodes 423 and 424. Diodes 422 and 425 will start to conduct, driving the voltage across the signal capacitor 3086 more negative. When, the voltage across the signal capacitor 3086 becomes less than the error signal 305, the output $B_0$ will again go negative and the process described in the previous paragraph will repeat.

As the voltage across the signal capacitor 3086 approaches the voltage of the quantization error signal 305, the output $B_0$ will start to toggle between 1 and 0 at a frequency equal to the clock frequency of the D flip-flop 3084. Having the output $B_0$ toggle forces the voltage across the rate capacitor 406 to approach 0 due to the rate capacitor's averaging effect. As the voltage across rate capacitor 406 approaches 0, the diode bridge circuit 420 of the rate control circuit will provide decreasing charging current to the capacitor 3086 absent a change in the input signal. Thus, the initial large charging current diminishes rapidly as the voltage across the signal capacitor 3086 approaches the voltage of the quantization error signal 305. This diminishing charging rate provided by the rate control circuit 400 allows a delta modulator to have an extremely high degree of resolution—the principle limit on the resolution being the resolution of the comparator 3082.

The output digital representation of the third embodiment 300 will also eliminate the need for dithering to avoid quantization noise of low level signals or slowly changing signals. Low level signals are processed purely by the disclosed embodiment of the delta modulator and not by the normal analog to digital converter in this signal processor. The analog to digital converter disclosed herein does not produce the type of quantization noise common in typical delta modulators or in standard analog to digital converters due to the absence of gates closing or opening in that situation. Further those of ordinary skill in the art will readily understand how to change the processor to increase the number of bits of parallel resolution for the processor 300.

Figure 10:
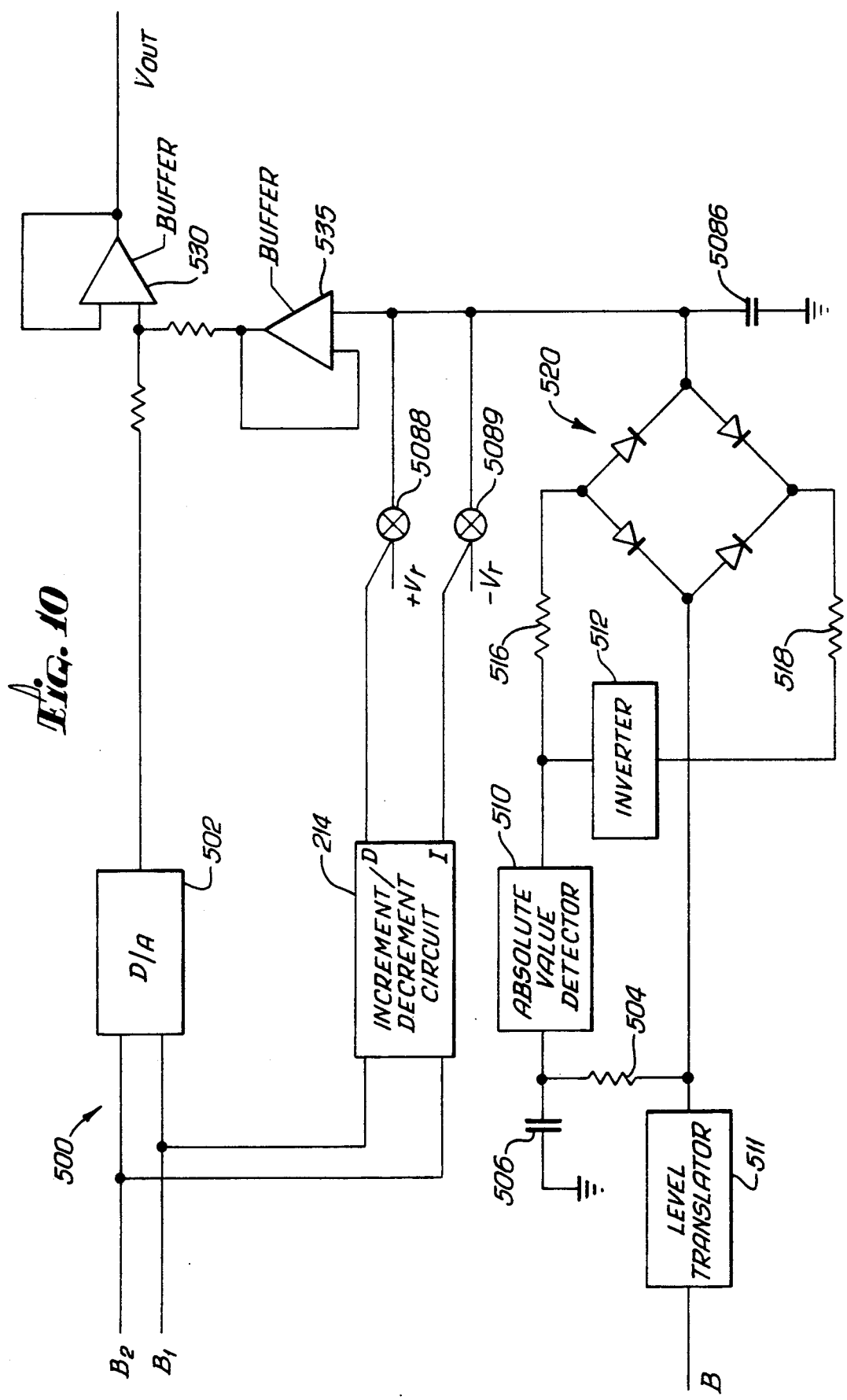
FIG. 10 is a schematic of a digital to analog signal processor that is compatible with the third embodiment shown in FIG. 8.

FIG. 10 shows the appropriate digital to analog signal processor 500 that should be used with the processor shown in embodiment 300. The two most significant bits $B_2$ and $B_1$ are applied to a standard digital to analog converter 502 having a resolution of two bits. The resultant analog signal 503 is applied to one input of a summing amplifier 53. The least significant bit $B_0$ is applied to a rate control circuit 400 that is identical to the rate control circuit described in FIG. 9. The two most significant bits are also applied to the increment/decrement circuit 214 of the type described in FIG. 7. The increment and decrement signals of the circuit 214 control analog switches 5088 and 5089 for applying either $+v_r$ or $-v_r$ in the appropriate manner to preset a signal capacitor 5086 in the same manner that the signal capacitor 3086 is preset.

Serial input bit $B_0$ is applied to a level translator 511. Diode bridge 520 operates in the same manner that the diode bridge 420 operates to steer current and an inverter 512, an absolute value detector 510, resistors 514, 516, and 504, a rate capacitor 506 and a signal capacitor 5086 operate in the same manner as the corresponding parts operate in the rate control circuit 400 shown in FIG. 9. The voltage across the signal capacitor 5086 is applied to the summing amplifier 530 through a buffer amplifier 535. The output of that summing amplifier 530 provides an analog output signal $v_{out}$ that accurately represents the analog input signal within the tolerances of the amplifiers and comparator and with an allowance for the time delay of the circuit components. It should be noted that all of the capacitors, resistors, and diodes used in the digital to analog signal processor 500 should be selected to match the corresponding components used in the compatible analog to digital signal processor 300.

Figure 11:
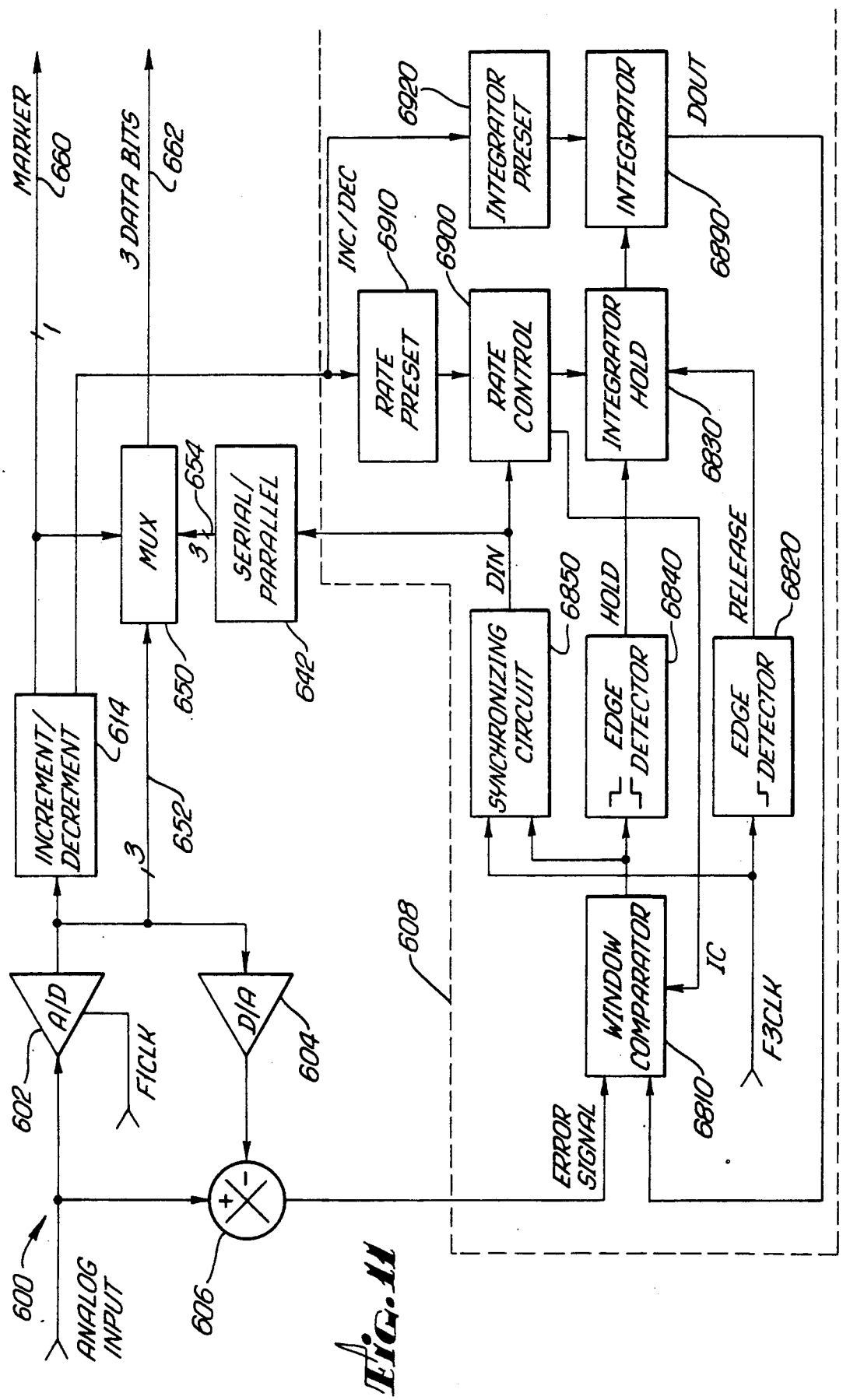
FIG. 11 is a block diagram of an analog to digital converter of the type disclosed herein connected to the digital optical disk drive write circuitry.

FIG. 11 shows how the disclosed analog to digital converter of the prior embodiments can be used for data storage of analog audio, facsimile or video images. This embodiment 600 includes (with like numbers representing like parts) a standard three bit analog to digital converter 602, a digital to analog converter 604, a differential amplifier 606, a delta modulator 608, a three bit increment/decrement circuit 614 of the type shown in FIGS. 3, 5, and/or 8 or of the type described below. As before, the output of the delta modulator 608 represents the quantization error of the standard analog to digital converter 602. In addition, the circuit further includes a two-to-one multiplexer 650, a 3 bit serial to parallel shift register 642, and outputs 660 and 662.

The serial output of the delta modulator 608 is converted into parallel delta data by a serial to parallel shift register 642 operating at the same frequency as the delta modulator 608. The increment/decrement 614 provides an increment (INC) and a decrement (DEC) signal to the delta modulator 608 for presetting both the rate control and integrator outputs.

The marker output 660 is generated by the increment/decrement circuit by forming a logical or of the increment and decrement signals. The marker signal is also coupled to the 2 to 1 multiplexer 650 having a three bit A input 652 and a three bit B input 654. The multiplexer 650 normally selects the B input from the shift register 642 as its output. If the marker output signal 668 indicates that at least one of the three bits from the analog to digital converter 602 has changed, the multiplexer 650 selects the A input data 652.

Preferably, to maintain synchronization of the circuitry, the frequency of the clock signal for the delta modulator 608 should be N times that of the clock signal for the analog to digital converter 602, where N represents the number of bits of resolution of the analog to digital converter 602. The clock signal for the shift register 642 should be equal to the clock frequency of the delta modulator 608. In the three bit embodiment of FIG. 11, the higher speed clock F3CLK operates at three times the frequency of the lower clock F1CLK.

The delta modulator 608 of this embodiment is similar to the delta modulator of FIG. 8 but includes two additional features. Added circuitry provides better synchronization between the clocked output of the A/D converter 602 and the output of the serial/parallel shift register 642. Also, the integrator of the rate control circuit has a preset circuit 6910. The integrator includes a window comparator 6810, a rising edge detector 6820, an edge detector 6840, a synchronizing circuit 6850, an integrator 6890, an integrator hold circuit 6830, a rate control circuit 6900, and an integrator preset circuit 6920.

The integrator preset circuit 6920 presets the voltage across the capacitor of the integrator 6890 of the delta modulator to the appropriate voltage level as described in the embodiment of FIG. 11. Similarly, the capacitor (not shown) in the integrator of the rate control circuit 6900 is preset in a similar manner by the increment/decrement signal.

The capacitor of the integrator 6890 has a hold circuit 6830 that is set by the rising and falling edge detector 6840 from the window comparator 6820. The hold circuit is released by the output of the rising edge detector on the high speed clock F3CLK.

The output DIN of the delta modulator 608 comes from a synchronizing circuit 6850 that synchronizes the output of the window comparator 6810 with the F3CLK. The output of the synchronizing circuit DIN also acts as the input to the rate control circuit in a manner similar to bit B0 of FIG. 9.

The window comparator 6810 of FIG. 11 determines if the output of the integrator 6890 is within a window centered about the error signal supplied from the differential amplifier 606. The window is framed by the voltage used for generating the charging current for the integrator 6890 by the rate control circuit 6900. As explained in the rate control circuit of FIG. 9, as the integrator 6890 approaches the value of the error signal, this voltage approaches zero. Thus, as the output of the integrator 6890 approaches the level of the error signal, the window centered around the level of the error signal narrows.

FIGS. 12a through 14b show a detailed schematic for the embodiment of FIG. 11. The values for all resistances are shown in ohms and the values for all capacitances are shown in farads. Vcc1 and Vcc2 are +5 volts and Vcc3 is −5 volts, DC, VRef is −2.5 volts, and −Vaa is −5 volts. All operational amplifiers are LF347 integrated circuits and all comparators are LM393 integrated circuits available from National Semiconductor. All diodes are 1N4148 diodes, all analog switches are 74HC4316 CMOS switches and all transistors are either PN2907 or PN2222 transistors as labelled. The two digital to analog converters are a 3304 available from Harris Semiconductor and a DAC-08 available from Motorola as labelled. All digital logical circuits are 74HCxx CMOS logic circuits available from numerous manufacturers where xx indicates the last digits for the parts. For example, the serial to parallel shift register 642 comprises a 74HC164 integrated circuit. All bidirectional analog switches are CMOS 74HC4316 analog switches available from Signetics. The clock signals are as follows: F1STRB is a strobe signal at the low clock frequency of f, F3CLK is a clock signal at 3f, and N—F3CLK is an inverted F3CLK signal.

Figure 12B:
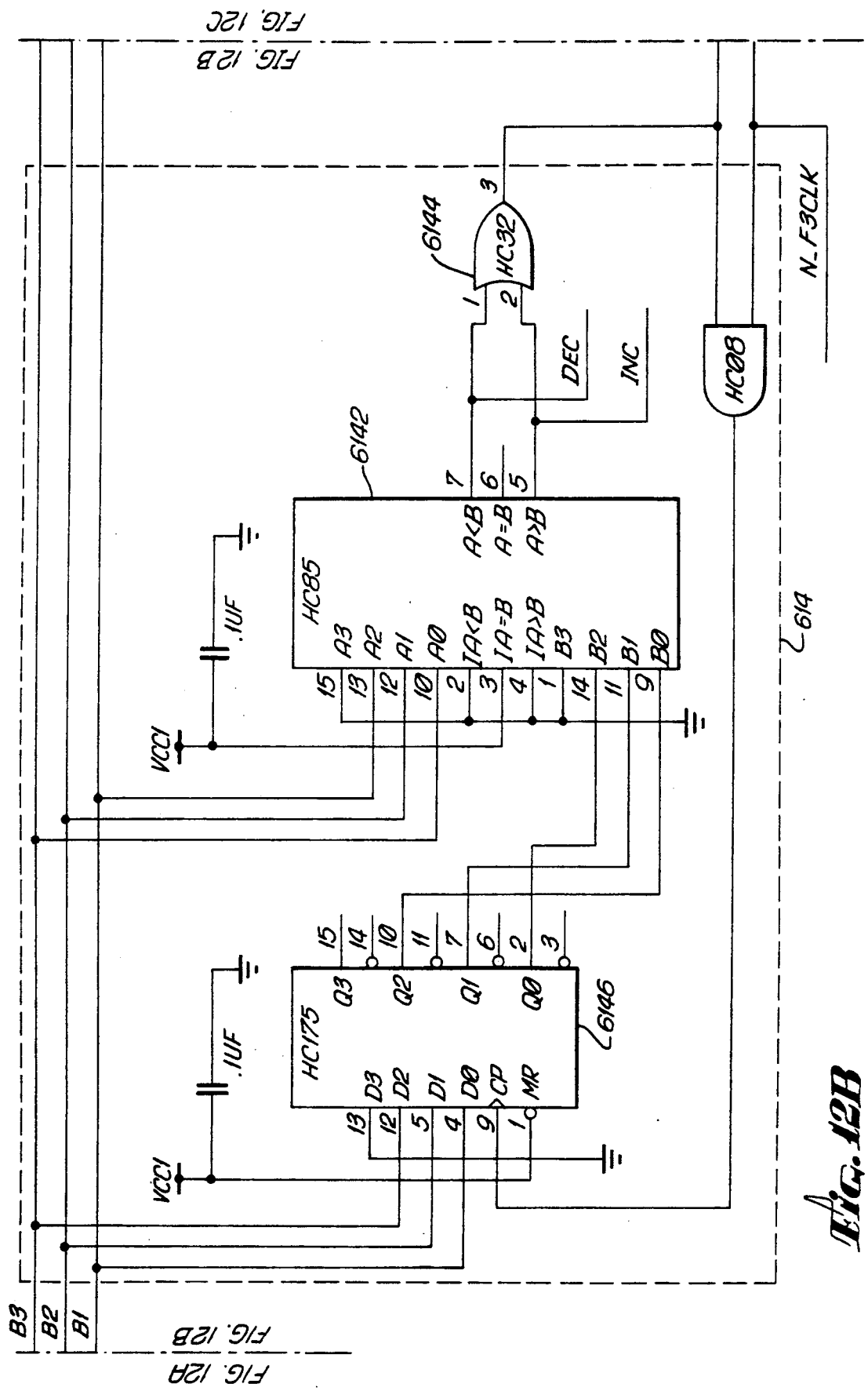
Figure 12C:
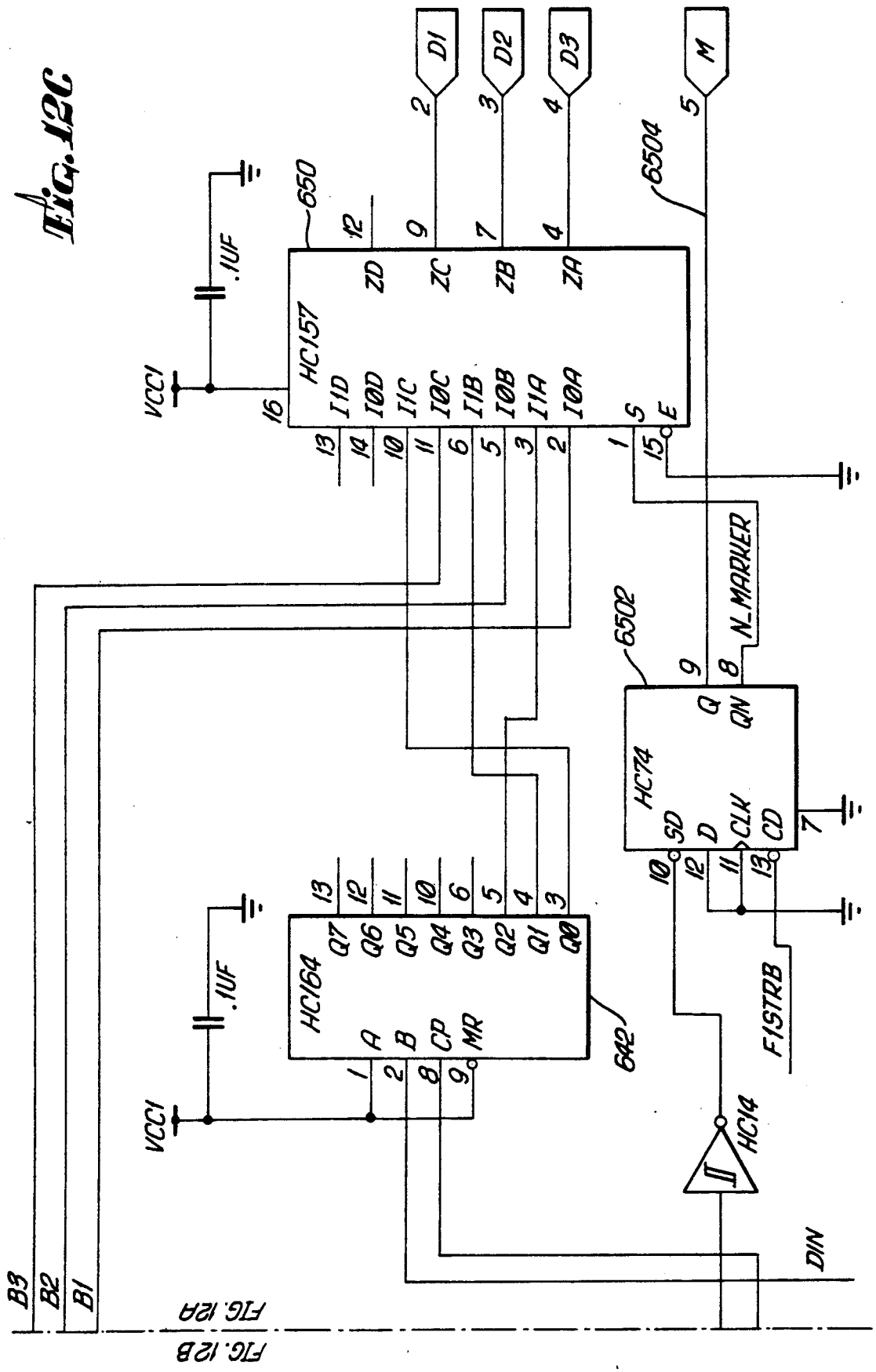
Figure 13B:
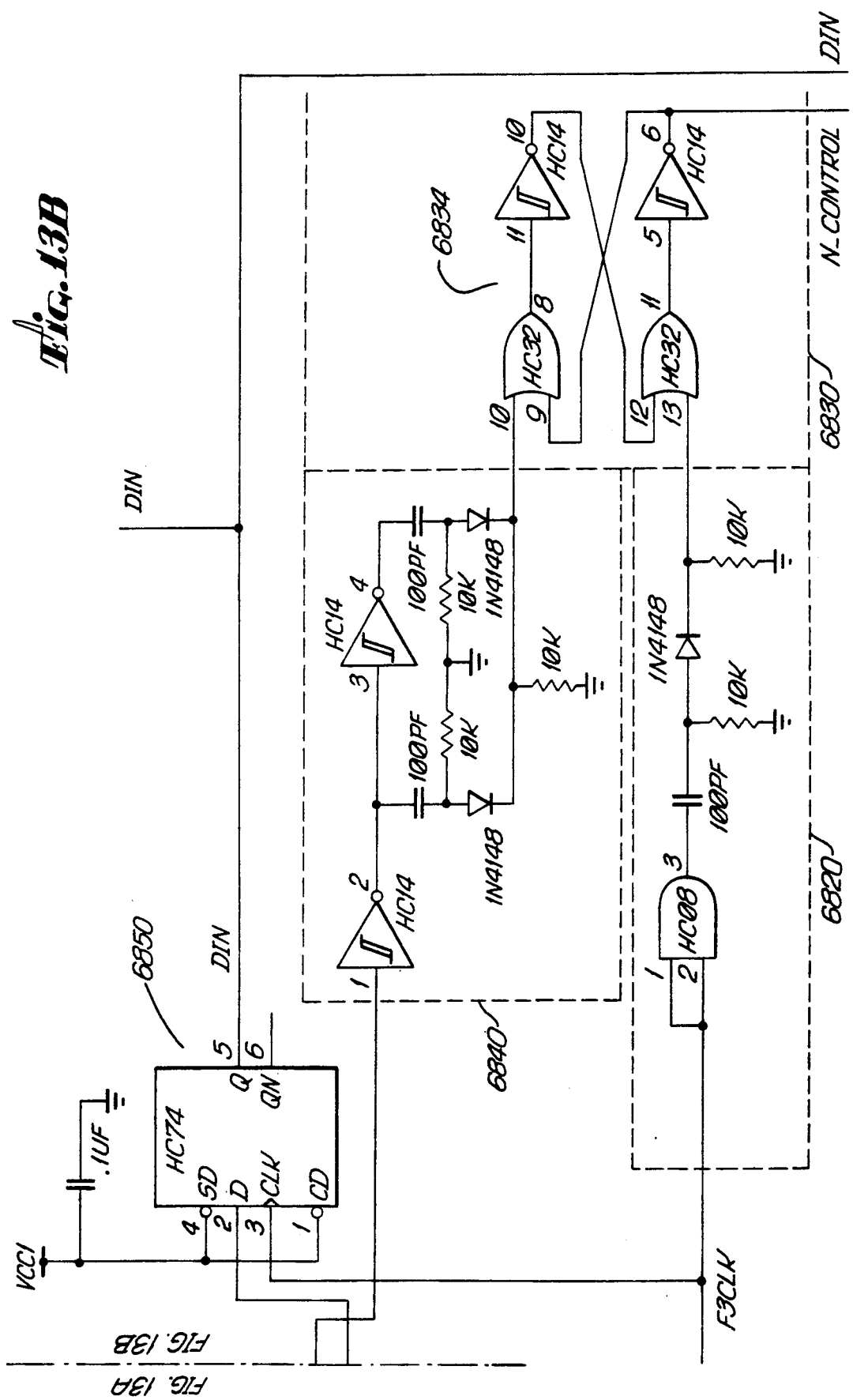

The analog input circuit is provided at pin 18 on FIGS. 12a-12c and is supplied to a three bit A/D converter 602 through a buffer amplifier 601. The A/D converter 602 creates a first sequence or set of three bits of a normal digital data representation B3-B1 of an analog input signal. Those three bits are converted back into an analog signal by converter 604. An error signal representing the difference between the actual analog input signal and the three bit representation of that analog signal is created at the output of the differential amplifier 606.

The three bits digital representation are also provided to an increment/decrement circuit 614. The current three bits of data B3-B1 of digital representation are compared with the immediate prior three bit digital representation stored by the flip flop 6146 to determine if there has been a large increase or decrease in the analog to digital signal. If there has been an increase or decrease, an appropriate increment (INC) signal or decrement (DEC) signal is created by a digital comparator 6142. The OR gate 6144 creates a signal indicating a change in the three bits which is combined with the N—F3CLK signal latches the three bits at the flip flop 6146.

The output of the or gate 6144 is also latched at the flip flop 6502 to create the marker signal 6504. The marker signal 6504 indicates that the three bits B3-B1 have changed.

The serial data from the delta modulator DIN is provided to a serial to parallel shift register 642 that provides three parallel bits to the multiplexer 650. The multiplexer is driven by the inverted marker signal N—Marker to select the three bits from the shift register 642 as the output D1 through D3 whenever bits B1 through B3 remain unchanged. However, when bits B1 through B3 change, the N—Marker signal causes bits B1 through B3 to be the output at D1 through D3. Thus, the output signals of the A/D converter are as follows:

Marker—*When High* this signal indicates that the three bits currently being output represent parallel data providing a three bit digital representation of the input signal having three bits of resolution; *When low*, this signals indicates that the three bits currently being output represent a set of serial delta modulation data of the quantization error for the most recently combined into parallel data.

D1-D3—These three data bits represent sequential sets of parallel digital representation or serial data from the delta modulator reflecting the quantization error when the marker signal is low.

FIGS. 13a through 14b explain the details of the delta modulator 608. The error signal is applied as one input to the window comparator 6810. The signal IC, which as explained in more detail below provides an approximation of the anticipated difference between the error signal and the output of the integrator DOUT, is another input to the window comparator. Op amps 6812 and 6814 provide a voltage window centered around the error signal to the comparators 6816 and 6818. The width of that voltage window is proportional to the signal IC. Comparators 6816 and 6818 set the Q output of the flip flop 6819 high if the signal DOUT from the integrator of the delta modulator 6890 (FIG. 10) is within the voltage window centered about the error signal. Otherwise, the Q output is cleared low by the Comparators 6816 and 6818. The clock and the D input of the flip flop 6819 are preferably grounded (not shown).

The synchronizing circuit 6850 synchronizes the Q* output from the flip flop 6819 to the F3CLK clock. The output of the synchronizing circuit 6850 is the serial output data DIN provided by the delta modulator 608 to the serial to parallel shift register 642 (FIG. 11).

The rising and falling edge detector circuit 6840 and the rising edge detector circuit 6820 provide the hold and release signals to the integrator hold circuit 6830 comprised of an S-R flip flop 6834 and the analog switch 6832.

Figure 14B:
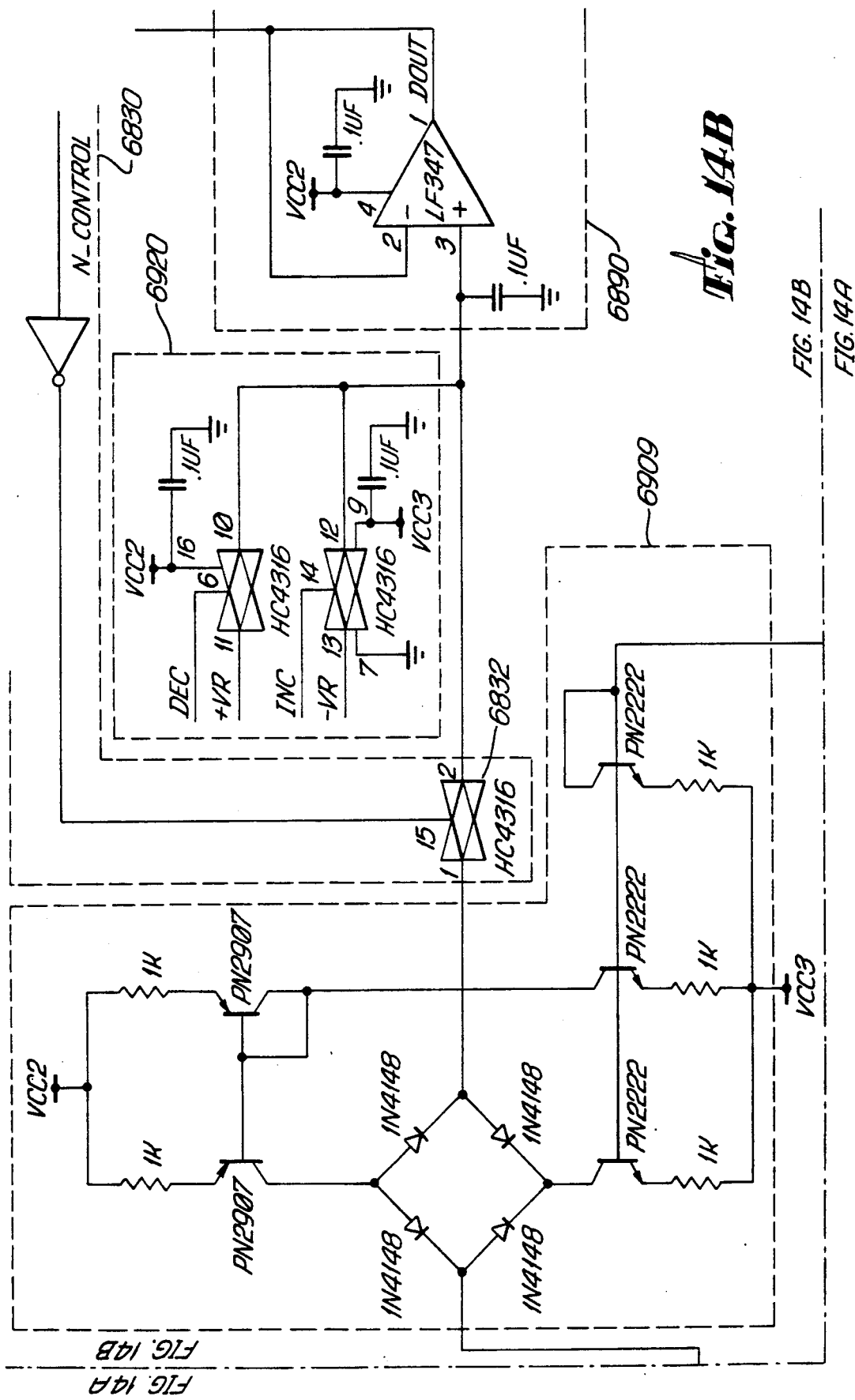

FIGS. 14a and 14b shows the rate preset circuit 6910, the rate control circuit 6900, the integrator 6890 and the integrator preset circuit 6920. The rate control circuit comprises a level shifter 6902, a rate control integrator 6904, an absolute value amplifier 6906, a voltage to current converter 6908 and a current steering circuit 6909.

The serial data out DIN is supplied to the rate control circuit 6900 through a level shifter 6902 in a manner substantially identical to the manner that the level shifting circuit 402 in FIG. 9 operates. VREF is −5 volts. The output of the level shifter 6902 is supplied to both the current steering circuit 6909 and the integrator 6904 in a manner that is similar to the integrator 40 and 406 of FIG. 9.

However, one difference between the rate control integrator 6904 and integrator of FIG. 9 is that the rate control preset circuit 6910 presets the value of the integrator under control of the increment (INC) and decrement (DEC) signals. VR2 has the same magnitude as VREF. The use of presetting allows for faster initial charging or discharging of the capacitor 6892 in the integrator 6894 after a change in the three bit representation B3-B1 of the analog input signal.

The output of the rate control circuit integrator 6904 is coupled to the absolute value amplifier 6906 that operates in a manner similar to the absolute value amplifier 410 of FIG. 9. The output IC of the absolute value amplifier 410 provides a signal representative of how close the output of the delta modulator DOUT is to the error signal. The voltage to current converter 6908 supplies the appropriate charging current to the steering circuit 6909, which operates in the same manner as the diode bridge 420 steering circuit shown in FIG. 9.

The output of the current steering circuit is normally supplied through the analog switch 6832, which is part of the integrator sample and hold circuit 6830 to the integrator 6890. However, when the edge detector 6840 provides the hold signal, the switch 6832 is opened and no charging current is provided to the integrator 6890.

The integrator 6890 also is coupled to an integrator preset circuit 6920. The integrator preset circuit 6920 operates in a manner similar to the preset circuit 3088 and 3089 shown in FIG. 8. The output of the integrator 6890 is called DOUT.

The manner in which the signal IC supplied from the absolute value amplifier 6906 to the window comparator 6810 is greatest when the integrator has just been preset. The reason that the maximum value occurs at this time is because the output of the level shifter 6902 tends to drive the voltage across the capacitor in the integrator 6905 to zero. Thus, the maximum value for IC and, therefore the maximum window for the window comparator, occurs when the value of the three most significant bits has just changed. Thereafter, the size of that window diminishes towards zero as the output of the integrator 6890 DOUT more closely approximates the error signal.

The result of the three bit embodiment of FIGS. 11 through 14 is an analog to digital converter circuit that provides audio fidelity to the ear with far fewer bits of data. If the marker signal is combined with the other bits using any of several well known compression techniques such as Huffman coding, the output signal is only three bits. To the ear, the difference between the reconstructed output of such an analog to digital converter to a standard 16 bit analog to digital converter for digital audio is indiscernable. Thus a system that uses 3.07 bits/sample (including the marker signal with compression) can be equivalent to the ear to a system that uses 16 bits/sample. Of course, error correction coding may add additional bits.

FIG. 15 shows an embodiment 700 for an digital to analog converter that is compatible with the converter 600 of FIG. 11. Normally, the inputs D1 through D3 and the marker signal would be supplied by a digital storage device such as a compact disc player or a digital audio tape. The three digital data bits represent a set of a standard parallel three bit digital representation of an analog signal when the marker signal is high and represent a three bit combination or set of serial delta modulation data of the quantization error signal when the marker is low. Typically, the input D1 through D3 and the marker signal will be sequential data sets from the output of a digital storage device such as digital audio tape or a compact disc player or other optical storage device.

The three bits of input shown in FIG. 15 are supplied to both a parallel to serial converter 742 and a latch 7850. When the marker signal is low, indicating that the three data bits are the serial data from the delta modulator, the data is loaded into the parallel to serial shift register 742. When the marker signal is high, indicating that the data is parallel data from the A/D converter 602, the data is stored at the latch 7850. The latched parallel data is converted into an analog signal by a standard D/A converter 702. The latched data is also supplied to an increment/decrement circuit to create the increment (INC) and decrement (DEC) signals.

When the three input data bits represent delta modulator data, the parallel to serial converter 742 changes the input data into serial data at DIN. The DIN signal is supplied to the rate control circuit 7900 and to the window comparator 7810. The rate control circuit 7900 and a rate preset circuit 7910 operate in a manner similar to the rate control circuit 6900 and the rate preset circuit 7910 shown in FIG. 11. Similarly, the integrator preset circuit 7920, the integrator 7890 and the integrator hold circuit 7830 operate in a manner that is similar to the integrator preset circuit 6920, the integrator 6890 and the integrator hold circuit 6830 shown in FIG. 10. Further, the output of the integrator 7890 DOUT is added to the output of the digital to analog converter 702 at the adder 730 to reconstruct the analog signal. The analog signal is then filtered by the low pass filter 760 to remove switching noise to supply the analog reconstructed output signal.

The sample and hold circuit 7870 stores the value of DOUT at the F3CLK rate whenever there is no marker signal. An offset voltage IC proportional to the current produced by the rate control circuit 7900 is used to create a window about the sampled and held DOUT value. Further, the DIN signal is used to provide appropriate controls to the window comparator 7810 to generate a hold/release control signal supplied to the integrator sample and hold 7830.

Figure 16:
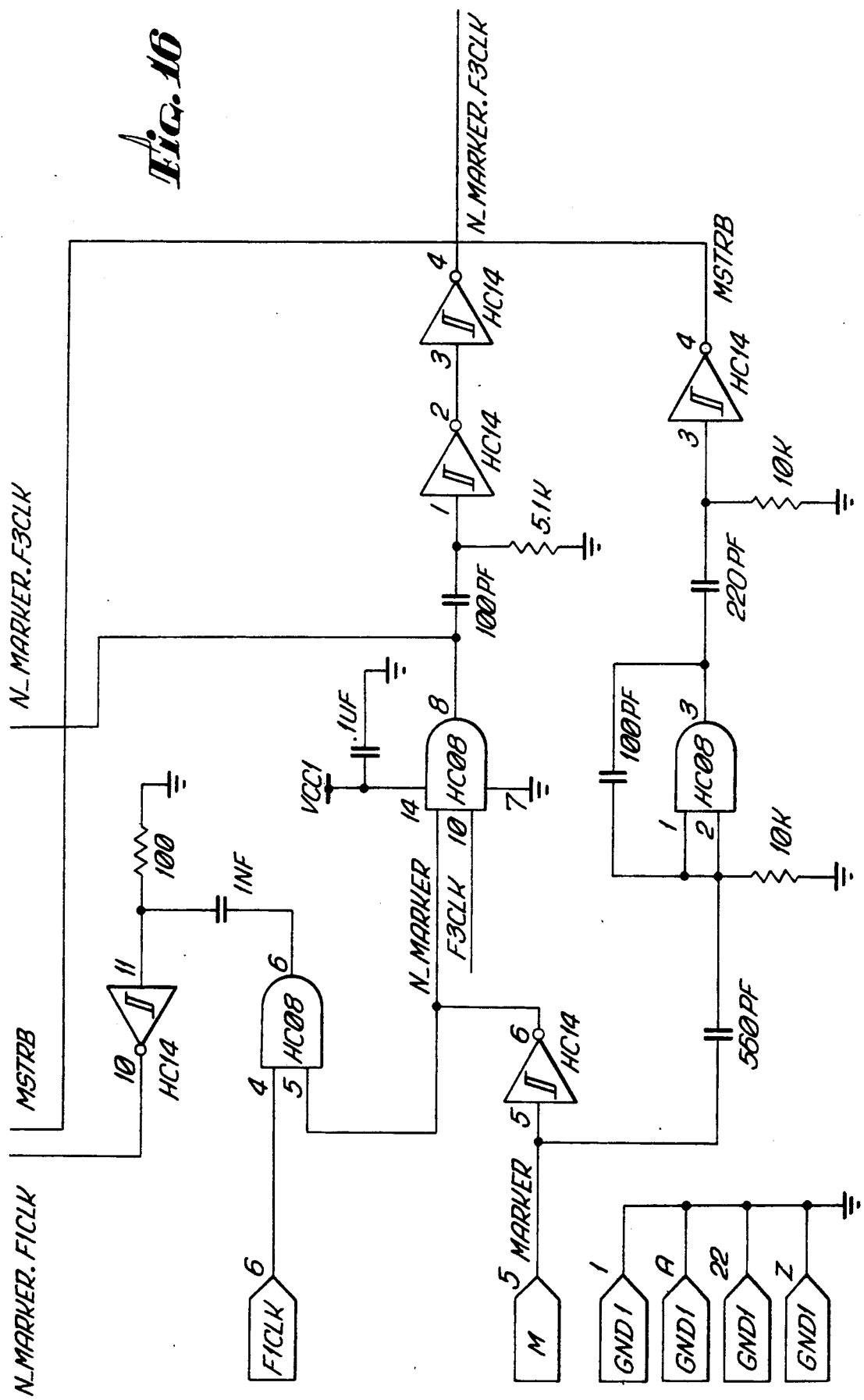
Figure 17:
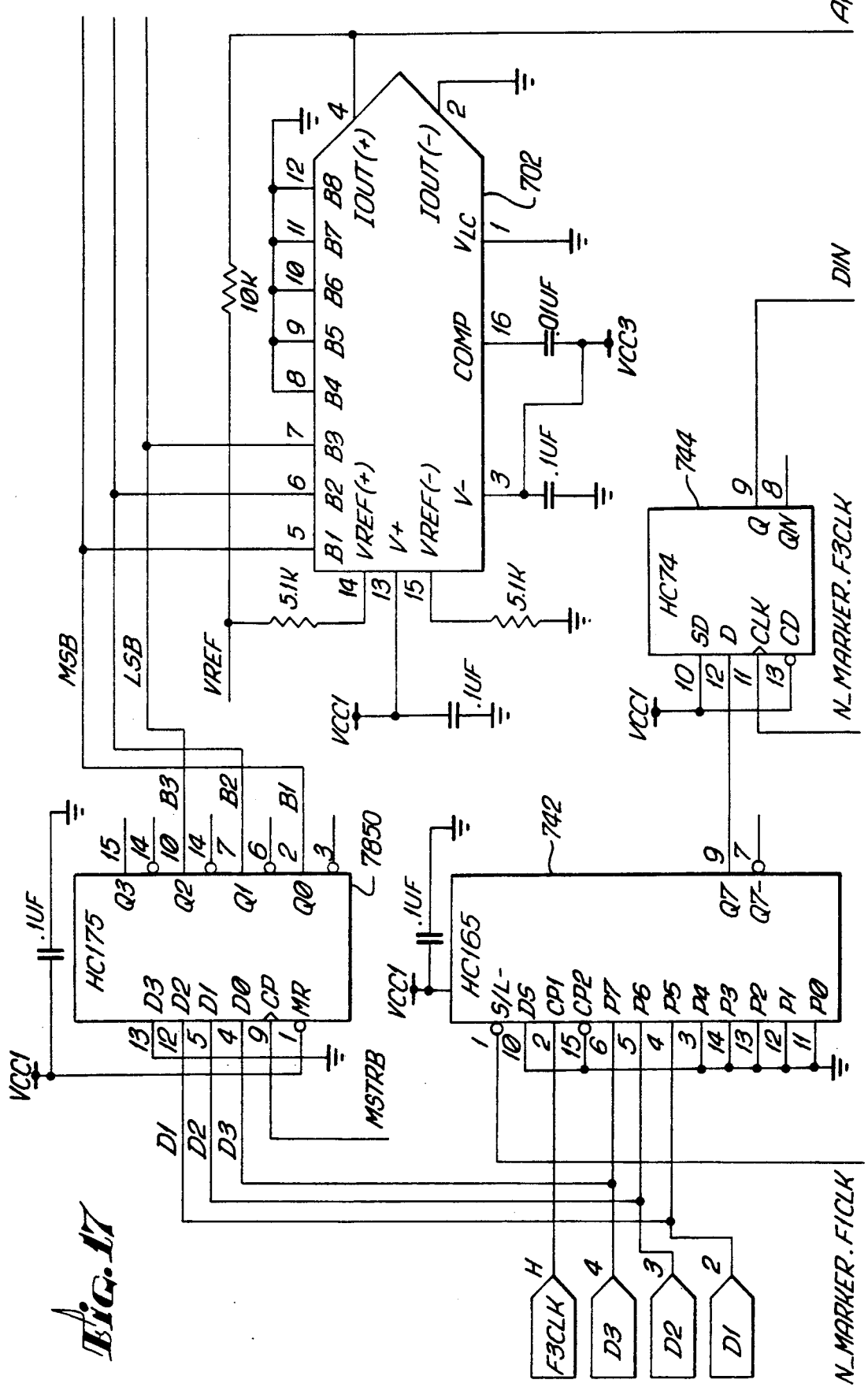

FIGS. 16 through 20 show detailed schematics for the embodiment of FIG. 15. FIG. 16 shows how various timing signals required in other parts of the embodiment of FIG. 15. The same labelling conventions are used on FIGS. 16 through 20 as were used in FIGS. 12a through 14b. The input data are D1 through D3. Further, the term N—Marker is the inverted marker signal.

When the marker signal is high, the next set of input data D1 through D3 represent normal, parallel, A/D data and are latched at the latch 7850 for conversion to a first analog signal A1 at the output of the D/A converter 702. The latching of the normal, parallel, A/D data is controlled by a strobe signal created from the marker signal.

When the marker is low, however, the parallel to serial shift register 742 will load the incoming sets of delta modulation data D1 through D3 at the F1CLK rate. The input to the shift/load* control of the shift register is the N—Marker signal anded with the F1CLK. The data is shifted out of the shift register 742 by the clock F3CLK, which is three times as fast as F1CLK. The now serial delta modulation data is then latched by the latch 744 and provides an input DIN to the rate control circuit 7900.

The rate control circuit 7900 (FIGS. 18a-18b) comprises a voltage level shifter 7902, an integrator 7904, an absolute value detector 7906, a voltage to current converter 7908, and a current steering circuit 7909. FIGS. 18a and 18b also show the rate control preset circuit 7910, an integrator 7890 and an analog switch 7832 that forms part of the sample and hold 7830 for the integrator 7890. The output of the integrator 7890 is DOUT and the output of the absolute value detector 7906 is the signal IC. It should be noted that all of the elements in FIGS. 18a and 18b operate in the same manner as the corresponding components of FIGS. 14a and 14b. For example, the signal IC is maximum just after the increment (INC) or decrement (DEC) signals preset the rate control integrator 7904.

Figure 19:
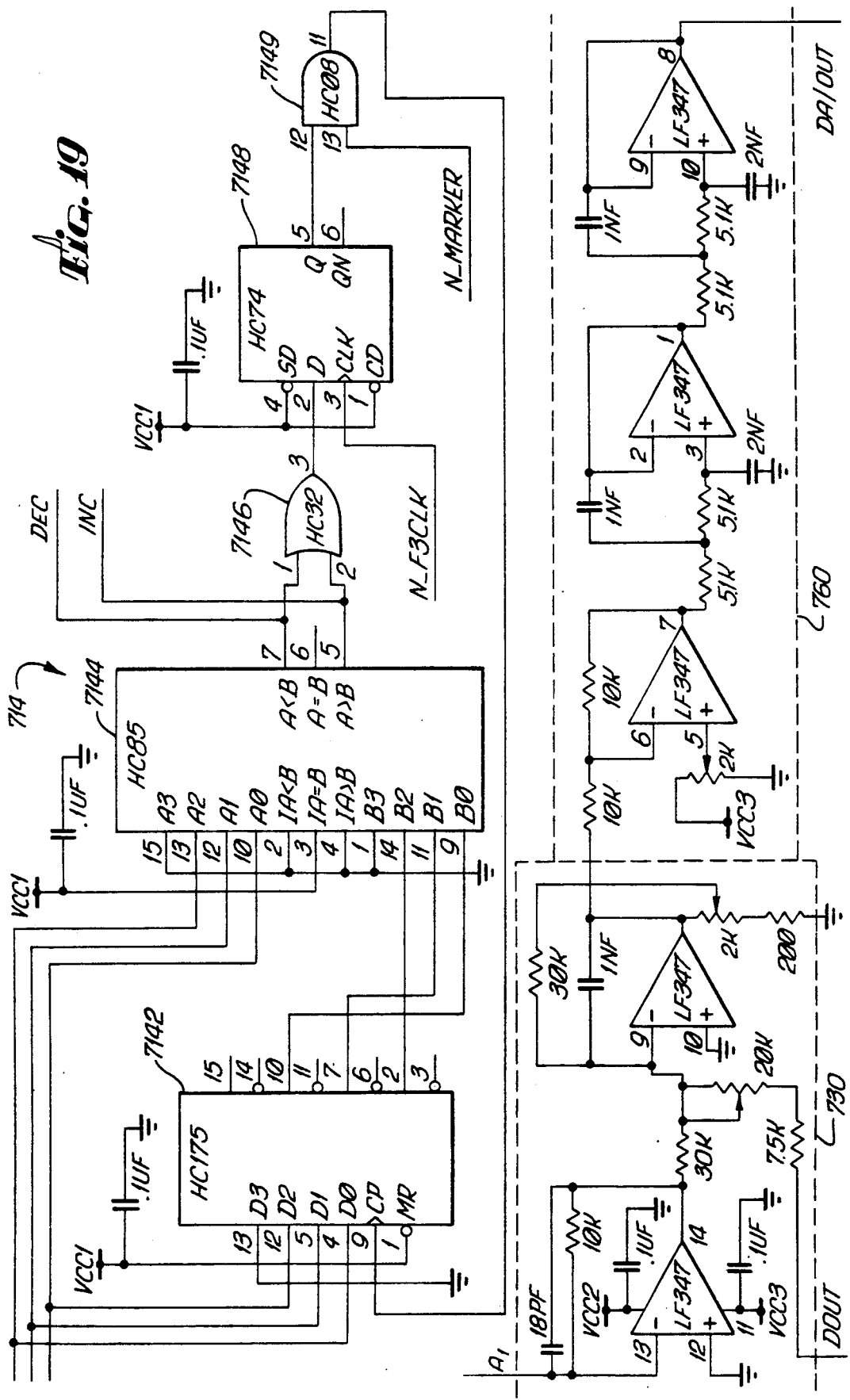

The increment (INC) and decrement (DEC) signals are generated by the increment/decrement circuit 714 portion of the circuit shown on FIG. 19. The prior 3 bit normal A/D data is stored by a latch 7142 and is compared with the current 3 bit normal A/D data stored at the latch 7850 by a digital comparator 7144. If the data is different, the appropriate increment (INC) or decrement (DEC) signal is generated. The OR gate 7146, the latch 7148 and the AND gate 7149 generate the clock pulse for the latch 7142 with the inverted F3CLK (N—F3CLK) and the inverted marker N MARKER.

FIG. 19 also shows the low pass filter 760 and the adder 730. The analog output A1 from the normal D/A converter 702 is added to the output of the integrator 7890 to generate the analog output signal of the processor 700. The low pass filter 760 removes switching noise from that output signal.

Figure 20:
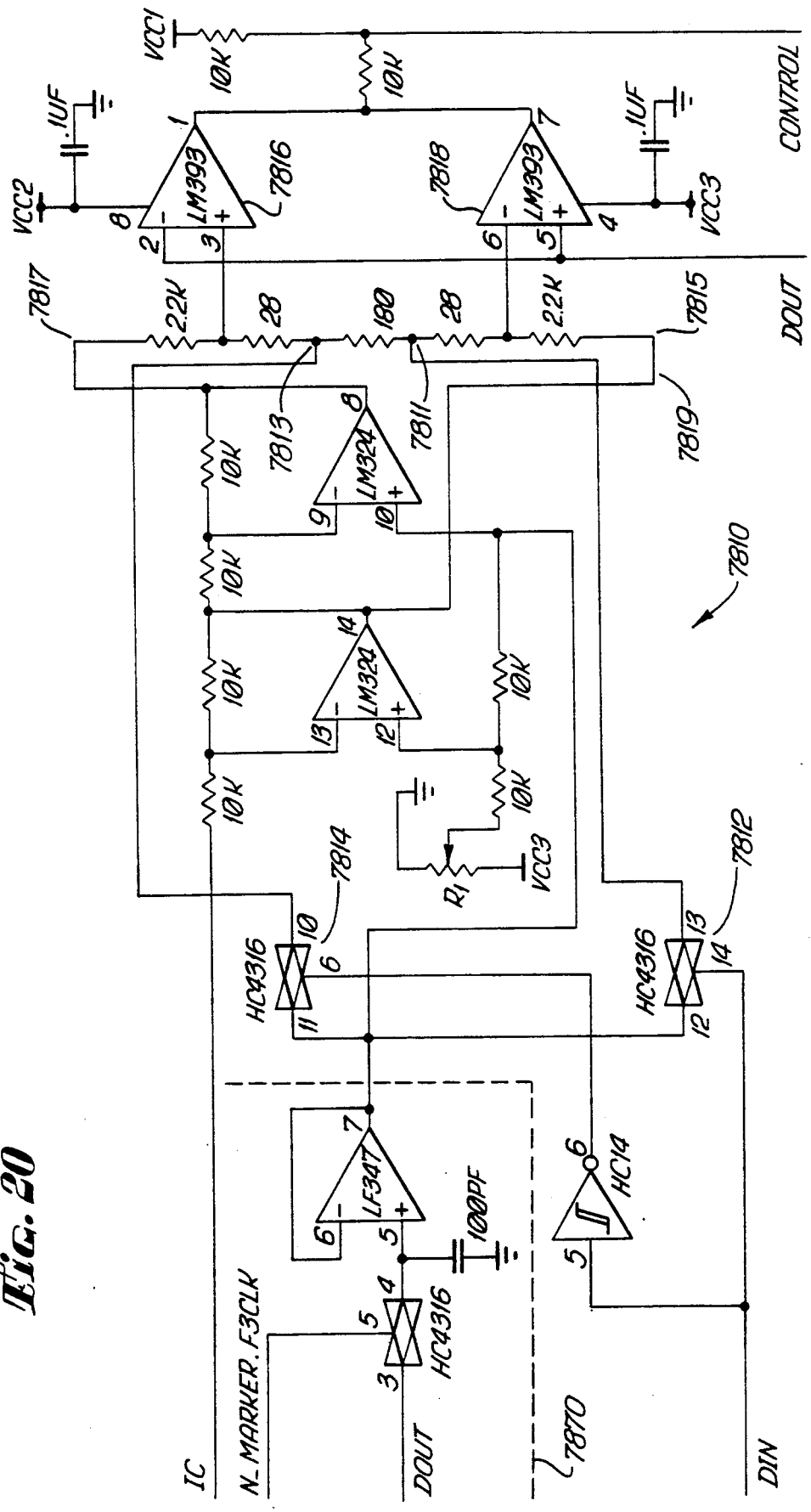

FIG. 20 shows the detailed schematic for the sample and hold 7870 and the window comparator 7810. The output of the integrator DOUT is sampled by the sample and hold 7870 by the F3CLK whenever there is no marker signal.

The window comparator 7810 determines if the current output DOUT from the integrator is within one of two different voltage windows from the sample and hold. Which of the windows is used depends upon the signal DIN, the latched, serial delta modulation data. The voltage applied to across a voltage divider 7819 is symmetric; i.e., the voltage at node 7817 has the same magnitude and the opposite polarity of the voltage at node 7815 with respect to the sampled voltage DOUT. The magnitude of the voltages are a sum of a reference voltage at the output of potentiometer R1, the sampled and held DOUT and minus the voltage IC. The reference at the output of R1 should be adjusted based upon the characteristics of the amplifiers used so that the two different voltage windows are greater than zero.

Obtaining two different voltage windows to compare the DOUT signal against is achieved by the use of switches 7814 and 7812 in response to the DIN signal. When the DIN is low, the node 7813 of the divider 7819 is forced to the sampled and held DOUT voltage level through the closed switch 7814. However, when DIN is high, the switch 7814 opens and the switch 7812 closes, forcing the node 7815 to the sampled and held DOUT voltage level.

The current output signal DOUT from the integrator 7890 is compared with either of the windows based upon the sampled and held DOUT. That comparison is used for determining if the hold circuit 7830 should allow the current steering circuit 7909 to charge the integrator 7890 through the switch 7832.

When the marker signal 668 indicates the output of the converter 602 has changed, the three bit sets of data at $B_1$ through B3 660 through 666 provide a three bit digital representation of the input signal Vin. Otherwise, the three bits of the shift register provide in a parallel format three bits of a signal representative of the quantization error of the converter 602.

Using the embodiments of FIG. 11 and 15, the three bit digital representation plus the marker at the output 660 through 668 will provide a digital signal representative of the analog input signal $V_{in}$ that the ear or the eye cannot readily distinguish from the original signal. As explained below, the number of bits needed can be substantially reduced for providing an audio or visual signal that is indiscernable to the ear or eye when passed through a speaker or video screen.

If the input analog signal is a band limited to the audio frequencies of below twenty-two kilohertz, the three bit circuit disclosed above can obtain excellent audio fidelity in compact disc or digital tape formats. Audio tests conducted with testing digitally recorded sound through speakers demonstrates that sound quality is audibly indistinguishable to the listener from normally recorded digital sound.

To conduct these audio tests, the applicant has recorded a signal using the disclosed three bit converter on compact discs made by ordinary compact disc recording equipment. Exemplars of the recording equipment are well known to those of ordinary skill in the art such as those shown in Chapter Seven of *The Compact Disc* (A-R Editions 1989) written by Ken C. Pohlman, which is incorporated herein by reference. The applicant has used the normal sampling rate of 44.2 kilohertz. Playback of such compact discs can be accomplished in a standard compact disc player with the disclosed digital to analog converter substituted for the currently used digital to analog converters.

Not only does the disclosed embodiment provide virtually the same perceivable, audible fidelity for digital audio reproduction, the quantity of data required to reproduce accurately an analog signal has been greatly reduced. For example, the current standard size audio compact disc could store approximately 5 hours of music using the disclosed converters.

The mini-compact discs that currently store about 10 minutes of a stereo audio signal could store about 70 minutes of such signals. Similarly, if a video signal is stored using the disclosed converters, a disc the size of a current compact disc could store sufficient video data for a two hour long video.

Although the specific embodiments described above represent analog to digital and digital to analog signal processors having three or four bits of resolution, those of ordinary skill in the art understand that additional bits can be added by including an standard converters with greater resolution. More bits increases the system's cost but also increases the speed at which a highly accurate representation of the signal is attained.

It will further be understood by those of ordinary skill in the art that many other alternative embodiments of the disclosed system can be built with double integration delta modulators, delta sigma modulators, or high information delta modulators. The scope of the invention is of course defined by the claims.

I claim:

1. A signal processor for storing a digital representation of analog input signal in a digital storage device, the circuit comprising:

a first analog to digital converter coupled to the input signal to produce first digital data of a plurality of bits representative of the input signal having a quantization error;

a second analog to digital converter producing a delta modulation digital data representative of the quantization error;

a third circuit coupled to the first digital data to detect a change in the output of the first converter; and a multiplexer coupled to select as the output the first data in response to the detection of the change by the third circuit an to otherwise select as the output the delta modulation data.

2. The processor of claim 1 wherein the processor further includes a serial to parallel shift register coupled between the multiplexer and the output of the second converter, wherein the number of parallel bits of output by the shift register is equal to the number of bits of the first converter.

3. The processor of claim 2, wherein the processor includes:

a present circuit that forces the data modulator to a first limiting voltage if the output of the converter has increased and forces the delta modulator to a second reference voltage if the output of the converter has decreased.

4. The processor of claim 1 wherein the first analog to digital converter operates at a first clock rate and the second analog to digital converter operates at a second clock rate and wherein the circuit further includes means for synchronizing the outputs of the two converters.

5. The processor of claim 1, wherein the delta modulator includes:
   a comparator that compares the quantization error with a second value;
   a rate control circuit producing an output of variable amplitude in response to the output of the comparator; and
   a variable speed integrator integrating the output of the rate control circuit to produce the second value.

6. The processor of claim 5, wherein the delta modulator further includes preset means to preset the output of the variable speed integrator and the output of the rate control circuit to certain desired signal levels in response to a change in the output of the first converter.

7. The processor of claim 6, wherein the delta modulator further includes a sample and hold circuit responsive to the output of the comparator to stop the integrator from integrating.

8. A process for converting an analog input signal into digital data for storage in a digital storage device, the process comprising:
   converting the analog input signal into sequential sets of first digital data representative of the input analog level having a quantization error;
   creating second sets of digital data representative of the quantization error; and
   selectively storing on a medium, being one of optical or magnetic storage devices, the second sets if there is no change between sequential first sets and otherwise storing the first set.

9. The method of claim 8, further including controlling the laser of a digital optical storage system in response to the selected one of the first and second sets.

10. The method of claim 8, wherein the creating of second sets of data is achieved by delta modulation.

11. The method of claim 8, wherein each set of data is a fixed number of bits.

12. The method of claim 10, wherein the delta modulation process includes the process of:
   integrating at a variable rate to produce an integrated value;
   determining if either of the quantization error or the integrated value is within a window centered about the other to produce the second sets of data; and
   producing control information in response to at least part of the second sets of data to control the rate of integration.

13. The method of claim 12, wherein the method of producing the control signals comprises integrating at least part of the second sets of data.

14. The method of claim 13, wherein the determining step includes examining at regular time intervals whether either the quantization error or the integrated value is within a window of the other to produce serial data and combining predetermined number of serial data to produce the second sets of data.

15. The method of claim 8, wherein the process further includes the step of determining if sequential sets of the first data are different and producing an output signal indicating whether such a change has occurred.

16. A signal processor for converting an analog signal represented in a sequential digital format, wherein the digital format is sequentially stored data comprised of sequences of a first type of digital data having a quantization error mixed with a second type of digital data representative to the quantization error of the first type of data and marker data indicating whether the sequential data is of the first or second type and wherein the circuit comprises:
   a first digital to analog converter responsive only to the first type of data and the marker data;
   a second digital to analog converter responsive to the second output and the marker data; and
   an analog adder responsive to the first and second converters, wherein the output of the adder approximates the stored analog signal.

17. The circuit of claim 16, wherein both the first and second types of sets of data have a predetermined number of bits
   wherein the circuit further includes a parallel to serial shift register to convert the second sets of data into serial data;
   wherein the second converter comprises an integrator responsive to the serial data from the shift register; and
   wherein the adder adds the output of the integrator to the output of the first converter.

18. The circuit of claim 17, wherein integrator is a variable rate integrator and the second converter further includes:
   a rate control circuit responsive to the output of the shift register for controlling the rate of integration.

19. The processor of claim 18, wherein the processor further includes presetting means for presetting the rate control circuit and the integrator in response to the detection of a new set of the first type of data.

20. A method for converting sequential digital data into an analog signal, the digital data including first digital data representative of an analog voltage level, the first digital data having a quantization error and further including second digital data representative of the quantization error, the method comprising:
   determining if the sequential digital data is the first digital data or the second digital data;
   converting the first digital data into a partial analog signal in response to the first digital data;
   integrating the second digital data into a quantization error signal;
   and summing the partial analog signal and the quantization error signal.

21. The method of claim 20, wherein the sequential data further includes a third type of data indicating whether a current data is either the first type or the second type.

22. The method of claim 21, wherein the method of integrating further includes determining if the quantization error signal is within a window of a second value.

23. The method of claim 22, wherein the second value includes a sampled and held value of the quantization error signal.

24. The method of claim 23, wherein the second value varies depending upon one of the bits in the received second type of data.

* * * * *